(12) United States Patent
Mukundan et al.

(10) Patent No.: US 12,320,595 B2
(45) Date of Patent: **\*Jun. 3, 2025**

(54) TOP CHAMBER CAVITIES FOR CENTER-PINNED ACTUATORS

(71) Applicant: Frore Systems Inc., San Jose, CA (US)

(72) Inventors: Vikram Mukundan, San Ramon, CA (US); Suryaprakash Ganti, Los Altos, CA (US); Ananth Saran Yalamarthy, Stanford, CA (US); Seshagiri Rao Madhavapeddy, La Jolla, CA (US); Prabhu Sathyamurthy, San Jose, CA (US); Narayana Prasad Rayapati, Mountain View, CA (US)

(73) Assignee: Frore Systems Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/370,732

(22) Filed: Sep. 20, 2023

(65) Prior Publication Data

US 2024/0060733 A1 Feb. 22, 2024

Related U.S. Application Data

(63) Continuation of application No. 17/367,057, filed on Jul. 2, 2021, now Pat. No. 11,796,262, which is a
(Continued)

(51) Int. Cl.
*F28F 13/10* (2006.01)

(52) U.S. Cl.
CPC .................................. *F28F 13/10* (2013.01)

(58) Field of Classification Search
CPC . H05K 7/20509; B81B 7/0093; H01L 41/042; H01L 41/047; F28F 13/10
(Continued)

(56) References Cited

U.S. PATENT DOCUMENTS

| 4,251,031 A | 2/1981 | Martin |
| 4,450,505 A | 5/1984 | Mittal |

(Continued)

FOREIGN PATENT DOCUMENTS

| CN | 101032718 | 9/2007 |
| CN | 101718235 | 6/2010 |

(Continued)

OTHER PUBLICATIONS

H.Q. Li, "A High Frequency High Flow Rate Piezoelectrically Driven Mems Micropump", Solid-State Sensors, Actuators, and Microsystems Workshop, Jun. 4-8, 2000, pp. 69~72.
(Continued)

*Primary Examiner* — Anatoly Vortman
(74) *Attorney, Agent, or Firm* — Van Pelt, Yi & James LLP

(57) ABSTRACT

A flow chamber, a cooling system and a method are described. The flow chamber includes an upper chamber including a top wall, an actuator, and a lower chamber. The actuator is located distally from the top wall. The lower chamber receives fluid from the upper chamber when the actuator is actuated. The top wall includes at least one cavity therein. The cooling system utilizes cooling cells including the flow chamber. The method includes driving the actuator at a frequency that directs fluid through the flow chamber.

20 Claims, 10 Drawing Sheets

Related U.S. Application Data continuation-in-part of application No. 16/915,912, filed on Jun. 29, 2020, now Pat. No. 11,464,140.

(60) Provisional application No. 62/945,001, filed on Dec. 6, 2019.

(58) Field of Classification Search
USPC ........................................ 361/688; 165/109.1
See application file for complete search history.

(56) References Cited

U.S. PATENT DOCUMENTS

| | | | |
|---|---|---|---|
| 4,595,338 A | 6/1986 | Kolm | |
| 4,667,877 A | 5/1987 | Yao | |
| 4,751,713 A | 6/1988 | Affleck | |
| 4,780,062 A | 10/1988 | Yamada | |
| 4,834,619 A | 5/1989 | Walton | |
| 4,923,000 A | 5/1990 | Nelson | |
| 5,008,582 A | 4/1991 | Tanuma | |
| 5,673,171 A | 9/1997 | Varghese | |
| 5,758,823 A | 6/1998 | Glezer | |
| 5,796,152 A | 8/1998 | Carr | |
| 5,821,962 A | 10/1998 | Kudo | |
| 5,861,703 A | 1/1999 | Losinski | |
| 6,211,598 B1 | 4/2001 | Dhuler | |
| 6,232,680 B1 | 5/2001 | Bae | |
| 6,450,773 B1 | 9/2002 | Upton | |
| 6,483,419 B1 | 11/2002 | Weaver | |
| 6,498,725 B2 | 12/2002 | Cole | |
| 6,531,947 B1 | 3/2003 | Weaver | |
| 6,570,750 B1 | 5/2003 | Calcatera | |
| 6,588,497 B1 | 7/2003 | Glezer | |
| 6,598,960 B1 | 7/2003 | Cabal | |
| 6,612,816 B1 | 9/2003 | Vanden Brande | |
| 6,650,542 B1 | 11/2003 | Chrysler | |
| 6,713,942 B2 | 3/2004 | Raman | |
| 6,771,158 B2 | 8/2004 | Lee | |
| 6,853,068 B1 | 2/2005 | Djekic | |
| 6,876,047 B2 | 4/2005 | Cunningham | |
| 6,996,441 B1 | 2/2006 | Tobias | |
| 7,023,697 B2 | 4/2006 | Pokharna | |
| 7,031,155 B2 | 4/2006 | Sauciuc | |
| 7,081,699 B2 | 7/2006 | Keolian | |
| 7,258,464 B2 | 8/2007 | Morris | |
| 7,282,837 B2 | 10/2007 | Scher | |
| 7,321,184 B2 | 1/2008 | Lee | |
| 7,324,323 B2 | 1/2008 | Aksyuk | |
| 7,420,807 B2 | 9/2008 | Mikubo | |
| 7,492,076 B2 | 2/2009 | Heim | |
| 7,516,776 B2 | 4/2009 | Bezama | |
| 7,553,135 B2 | 6/2009 | Cho | |
| 7,714,433 B2 | 5/2010 | Campini | |
| 7,742,299 B2 | 6/2010 | Sauciuc | |
| 7,972,124 B2 | 7/2011 | Hirata | |
| 8,051,905 B2 | 11/2011 | Arik | |
| 8,289,701 B2 | 10/2012 | Suzuki | |
| 8,297,947 B2 | 10/2012 | Van Rensburg | |
| 8,308,453 B2 | 11/2012 | Yamamoto | |
| 8,308,454 B2 | 11/2012 | Kamitani | |
| 8,520,383 B2 | 8/2013 | Park | |
| 8,520,384 B2 | 8/2013 | Park | |
| 8,659,896 B2 | 2/2014 | Dede | |
| 8,678,787 B2* | 3/2014 | Hirata | F04B 43/046 417/413.1 |
| 8,684,707 B2 | 4/2014 | Kanai | |
| 8,736,139 B2 | 5/2014 | Lee | |
| 8,899,944 B2 | 12/2014 | Kanai | |
| 8,934,240 B2 | 1/2015 | Yu | |
| 9,179,575 B1 | 11/2015 | Yao | |
| 9,215,520 B2 | 12/2015 | De Bock | |
| 9,252,069 B2* | 2/2016 | Bhunia | H01L 23/3735 |
| 9,466,452 B1 | 10/2016 | Liu | |
| 9,523,367 B2 | 12/2016 | Lucas | |
| 9,846,461 B2 | 12/2017 | Tang | |
| 9,976,547 B2 | 5/2018 | Tanaka | |
| 10,045,461 B1 | 8/2018 | Boozer | |
| 10,288,192 B2 | 5/2019 | Han | |
| 10,364,910 B2 | 7/2019 | Han | |
| 10,480,502 B2 | 11/2019 | Hirata | |
| 10,788,034 B2* | 9/2020 | Ganti | F04B 43/046 |
| 10,943,850 B2* | 3/2021 | Ganti | H05K 7/2039 |
| 11,043,444 B2 | 6/2021 | Ganti | |
| 11,242,241 B2 | 2/2022 | Menon | |
| 11,454,232 B2 | 9/2022 | Mou | |
| 11,456,234 B2 | 9/2022 | Ganti | |
| 11,466,674 B2 | 10/2022 | Chang | |
| 2002/0163782 A1 | 11/2002 | Cole | |
| 2002/0184907 A1 | 12/2002 | Vaiyapuri | |
| 2004/0023614 A1 | 2/2004 | Koplin | |
| 2004/0190251 A1 | 9/2004 | Prasher | |
| 2004/0196999 A1 | 10/2004 | Han | |
| 2004/0218362 A1 | 11/2004 | Amaro | |
| 2004/0244405 A1 | 12/2004 | Kim | |
| 2004/0253130 A1 | 12/2004 | Sauciuc | |
| 2005/0074662 A1 | 4/2005 | Cho | |
| 2005/0089415 A1 | 4/2005 | Cho | |
| 2005/0110841 A1 | 5/2005 | Silverbrook | |
| 2005/0178529 A1 | 8/2005 | Suzuki | |
| 2005/0211418 A1 | 9/2005 | Kenny | |
| 2005/0225213 A1 | 10/2005 | Richards | |
| 2005/0266286 A1 | 12/2005 | Sato | |
| 2005/0280994 A1 | 12/2005 | Yazawa | |
| 2006/0147324 A1 | 7/2006 | Tanner | |
| 2006/0164805 A1 | 7/2006 | Meinders | |
| 2006/0181848 A1 | 8/2006 | Kiley | |
| 2006/0208613 A1 | 9/2006 | Scher | |
| 2006/0232167 A1 | 10/2006 | Jordan | |
| 2006/0236710 A1 | 10/2006 | Vaiyapuri | |
| 2006/0250773 A1 | 11/2006 | Campbell | |
| 2006/0250774 A1* | 11/2006 | Campbell | H01L 23/4735 361/699 |
| 2006/0260784 A1 | 11/2006 | Bezama | |
| 2006/0268534 A1 | 11/2006 | Paydar | |
| 2007/0020124 A1 | 1/2007 | Singhal | |
| 2007/0037506 A1* | 2/2007 | Lee | F04D 33/00 454/184 |
| 2007/0048154 A1 | 3/2007 | Sapir | |
| 2007/0076375 A1* | 4/2007 | Mongia | F04B 45/047 257/714 |
| 2007/0235180 A1* | 10/2007 | Ouyang | H01L 23/473 165/287 |
| 2007/0274045 A1 | 11/2007 | Campbell | |
| 2008/0041574 A1* | 2/2008 | Arik | H01L 23/4735 165/80.2 |
| 2008/0101965 A1 | 5/2008 | Zhang | |
| 2008/0111866 A1 | 5/2008 | Silverbrook | |
| 2008/0218972 A1 | 9/2008 | Sauciuc | |
| 2008/0304979 A1 | 12/2008 | Lucas | |
| 2009/0021908 A1 | 1/2009 | Patel | |
| 2009/0034197 A1* | 2/2009 | Leija | H01L 23/467 165/185 |
| 2009/0050294 A1 | 2/2009 | Fedorov | |
| 2009/0085438 A1 | 4/2009 | Chrysler | |
| 2009/0120621 A1 | 5/2009 | Sheinman | |
| 2009/0148320 A1 | 6/2009 | Lucas | |
| 2009/0167109 A1 | 7/2009 | Tomita | |
| 2009/0174999 A1 | 7/2009 | Sauciuc | |
| 2009/0232683 A1* | 9/2009 | Hirata | F04B 45/047 417/413.2 |
| 2009/0232684 A1 | 9/2009 | Hirata | |
| 2009/0232685 A1 | 9/2009 | Kamitani | |
| 2010/0067191 A1 | 3/2010 | Arik | |
| 2010/0073431 A1 | 3/2010 | Silverbrook | |
| 2010/0074775 A1* | 3/2010 | Yamamoto | F04B 43/046 417/413.2 |
| 2011/0063800 A1 | 3/2011 | Park | |
| 2011/0068685 A1 | 3/2011 | Maeng | |
| 2011/0068799 A1 | 3/2011 | Wolf | |
| 2011/0096125 A1 | 4/2011 | Silverbrook | |
| 2011/0122582 A1 | 5/2011 | Park | |
| 2011/0211020 A1 | 9/2011 | Silverbrook | |
| 2011/0259557 A1 | 10/2011 | Chao | |
| 2011/0277491 A1 | 11/2011 | Wu | |

(56) References Cited

U.S. PATENT DOCUMENTS

| | | |
|---|---|---|
| 2011/0304240 A1 | 12/2011 | Meitav |
| 2012/0063091 A1 | 3/2012 | Dede |
| 2012/0171062 A1 | 7/2012 | Kodama |
| 2012/0301333 A1 | 11/2012 | Smirnov |
| 2013/0058818 A1 | 3/2013 | Hirata |
| 2013/0071269 A1 | 3/2013 | Fujisaki |
| 2013/0157729 A1 | 6/2013 | Tabe |
| 2013/0225065 A1 | 8/2013 | Lee |
| 2013/0233523 A1 | 9/2013 | Parida |
| 2014/0052429 A1 | 2/2014 | Kelkar |
| 2014/0192485 A1 | 7/2014 | Rau |
| 2014/0216696 A1 | 8/2014 | Donnelly |
| 2015/0007965 A1 | 1/2015 | Joshi |
| 2015/0009631 A1 | 1/2015 | Joshi |
| 2015/0043164 A1 | 2/2015 | Joshi |
| 2015/0173237 A1 | 6/2015 | Lin |
| 2015/0308377 A1 | 10/2015 | Packard |
| 2016/0025429 A1 | 1/2016 | Muir |
| 2016/0076530 A1 | 3/2016 | Chen |
| 2016/0353186 A1 | 12/2016 | Rothkopf |
| 2016/0358841 A1 | 12/2016 | Eid |
| 2016/0377072 A1 | 12/2016 | Wu |
| 2016/0377073 A1 | 12/2016 | Tanaka |
| 2017/0146039 A1 | 5/2017 | Lin |
| 2017/0222123 A1 | 8/2017 | Chen |
| 2017/0276149 A1 | 9/2017 | Dusseau |
| 2017/0292537 A1 | 10/2017 | Barak |
| 2017/0363076 A1 | 12/2017 | Najafi |
| 2018/0061737 A1 | 3/2018 | Arik |
| 2018/0145010 A1 | 5/2018 | Fukuoka |
| 2018/0146573 A1 | 5/2018 | Chen |
| 2018/0146574 A1 | 5/2018 | Chen |
| 2018/0187672 A1 | 7/2018 | Tanaka |
| 2018/0240734 A1 | 8/2018 | Liao |
| 2019/0062150 A1 | 2/2019 | Moitzi |
| 2019/0067550 A1 | 2/2019 | Mou |
| 2019/0085836 A1 | 3/2019 | Mou |
| 2019/0101938 A1 | 4/2019 | Mou |
| 2019/0128252 A1 | 5/2019 | Mou |
| 2019/0301442 A1 | 10/2019 | Hao |
| 2019/0309744 A1 | 10/2019 | Ting |
| 2020/0049143 A1 | 2/2020 | Ganti |
| 2020/0049386 A1 | 2/2020 | Ganti |
| 2020/0049387 A1 | 2/2020 | Ganti |
| 2020/0049388 A1 | 2/2020 | Ganti |
| 2020/0051895 A1 | 2/2020 | Ganti |
| 2020/0053905 A1 | 2/2020 | Ganti |
| 2020/0088185 A1 | 3/2020 | Mou |
| 2020/0229320 A1 | 7/2020 | Mou |
| 2020/0309111 A1 | 10/2020 | Mou |
| 2021/0131415 A1 | 5/2021 | Yalamarthy |
| 2021/0144884 A1 | 5/2021 | Mou |
| 2021/0176894 A1 | 6/2021 | Yalamarthy |
| 2021/0176895 A1 | 6/2021 | Mukundan |
| 2021/0180723 A1 | 6/2021 | Mukundan |
| 2021/0183739 A1 | 6/2021 | Sathyamurthy |
| 2021/0185853 A1 | 6/2021 | Ganti |
| 2021/0185856 A1 | 6/2021 | Ganti |
| 2022/0081284 A1 | 3/2022 | Ganti |
| 2022/0087058 A1 | 3/2022 | Sankar |
| 2022/0087064 A1 | 3/2022 | Ganti |
| 2022/0120269 A1 | 4/2022 | Mou |
| 2022/0150335 A1 | 5/2022 | Sathyamurthy |
| 2022/0187033 A1 | 6/2022 | Sankar |
| 2022/0189852 A1 | 6/2022 | Sathyamurthy |
| 2022/0282932 A1 | 9/2022 | Sathyamurthy |

FOREIGN PATENT DOCUMENTS

| | | |
|---|---|---|
| CN | 101785103 | 7/2010 |
| CN | 103828050 | 5/2014 |
| CN | 204436756 | 7/2015 |
| CN | 104832407 | 8/2015 |
| CN | 106206490 | 12/2016 |
| CN | 106849747 | 6/2017 |
| CN | 107642483 | 1/2018 |
| CN | 207287973 | 5/2018 |
| CN | 109641738 | 4/2019 |
| CN | 113898563 | 4/2022 |
| EP | 3290211 | 3/2018 |
| JP | S59152793 | 8/1984 |
| JP | S62149158 | 9/1987 |
| JP | S62199999 | 9/1987 |
| JP | H04065862 | 3/1992 |
| JP | H07263598 | 10/1995 |
| JP | H09246766 | 9/1997 |
| JP | 2000323882 | 11/2000 |
| JP | 2001119181 | 4/2001 |
| JP | 2002130198 | 5/2002 |
| JP | 2008159688 | 7/2008 |
| JP | 2008525709 | 7/2008 |
| JP | 2008263830 | 11/2008 |
| JP | 2010029759 | 2/2010 |
| JP | 2011144743 | 7/2011 |
| JP | 2013223818 | 10/2013 |
| JP | 2018022868 | 2/2018 |
| JP | 2018085510 | 5/2018 |
| JP | 2018085511 | 5/2018 |
| JP | 2018085512 | 5/2018 |
| JP | 6528849 | 6/2019 |
| KR | 20050026992 | 3/2005 |
| KR | 100594802 | 7/2006 |
| KR | 20070063029 | 6/2007 |
| TW | 200635493 | 10/2006 |
| TW | 201638469 | 11/2016 |
| TW | M542326 | 5/2017 |
| TW | 201814772 | 4/2018 |
| WO | 2014024608 | 2/2014 |

OTHER PUBLICATIONS

Liu et al., Application Prospects of Microfluidics Technology in Electronic Chip Cooling Research, Cryo & Supercond, vol. 37, No. 9, Sep. 16, 2009.

Murata Manufacturing Co., Ltd., Microblower MZB1001T02, Microblower (Air Pump), Micro Mechatronics, Apr. 2014, downloaded from: https://www.murata.com/en-us/products/mechatronics/fluid/microblower_mzb1001t02.

* cited by examiner

1100

1100

1100

TOP CHAMBER CAVITIES FOR CENTER-PINNED ACTUATORS

CROSS REFERENCE TO OTHER APPLICATIONS

This application is a continuation of U.S. patent application Ser. No. 17/367,057 entitled TOP CHAMBER CAVITIES FOR CENTER-PINNED ACTUATORS filed Jul. 2, 2021, which is a continuation in part of U.S. patent application Ser. No. 16/915,912, now U.S. Pat. No. 11,464,140, entitled CENTRALLY ANCHORED MEMS-BASED ACTIVE COOLING SYSTEMS filed Jun. 29, 2020, which claims priority to U.S. Provisional Patent Application No. 62/945,001 entitled CENTRALLY ANCHORED MEMS-BASED ACTIVE COOLING SYSTEMS filed Dec. 6, 2019, all of which are incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Consequently, additional cooling solutions for computing devices are desired. Moreover, such cooling systems may be desired to be optimized to better provide the desired cooling for mobile and other devices.

BRIEF DESCRIPTION OF THE DRAWINGS

Various embodiments of the invention are disclosed in the following detailed description and the accompanying drawings.

DETAILED DESCRIPTION

Figure 1A:
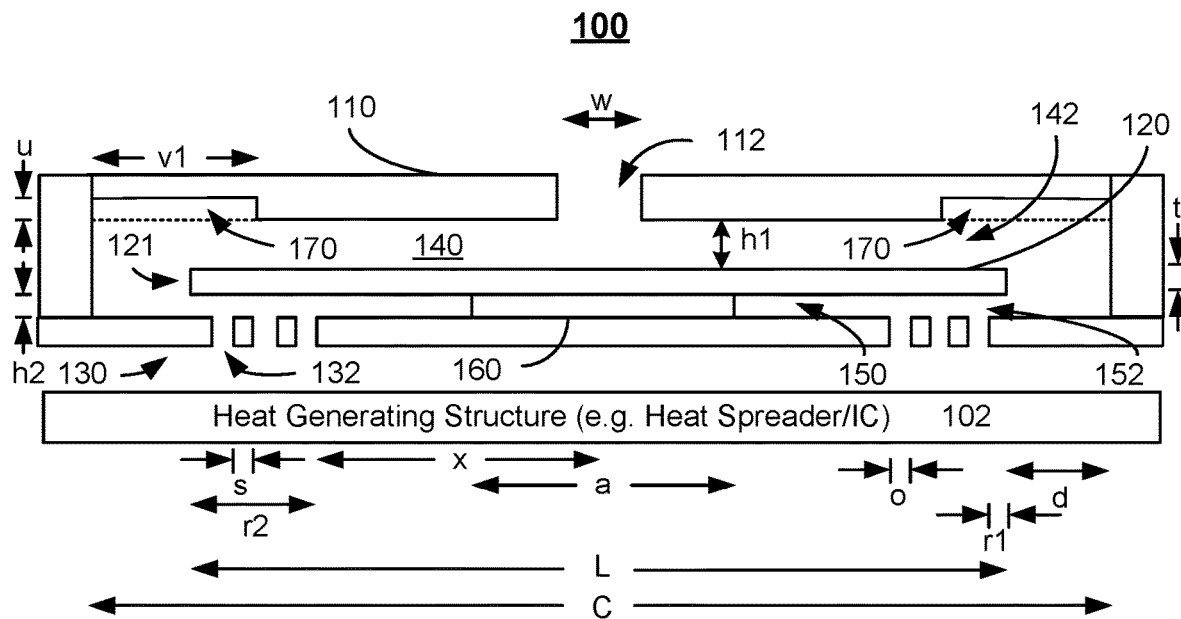
FIGS. 1A-1F depict an embodiment of an active cooling system including an actuator and cavities in the upper chamber.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan that can be energized in response to an increase in temperature of internal components. The fans drive air through the larger devices to cool internal components. However, such fans are typically too large for mobile devices such as smartphones or for thinner devices such as tablet computers. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated. Thus, additional cooling solutions capable of being used with smaller mobile devices as well as larger devices are desired.

Although described in the context of a cooling system, the techniques and/or devices described herein may be used in other applications. For example, the actuator may be used in other devices and/or the cooling system may be used for other purposes. The devices are also described in the context of actuators (i.e. cooling elements) that are coupled to a support structure at a central region or at the edges. In other embodiments, the actuator could be coupled to (e.g. anchored to) a support structure in another manner. For example, the actuator may be attached to the support structure along an edge of the actuator.

A flow chamber, which may be used in a cooling system, is described. The flow chamber includes an upper chamber including a top wall, an actuator, and a lower chamber. The actuator is located distally from the top wall. The lower chamber receives a fluid from the upper chamber when the actuator is activated. The top wall includes at least one cavity therein.

In some embodiments, the flow chamber includes a support structure. The actuator includes a central region and a perimeter. The actuator is supported by the support structure at the central region. At least a portion of the perimeter of the actuator is unpinned. The actuator is configured to undergo vibrational motion when activated to drive the fluid from the upper chamber to the lower chamber. In some embodiments, the actuator includes an anchored region and a cantilevered arm. The anchored region is fixed by the support structure. The cantilevered arm extends outward from the anchored region may include a step region, at least one extension region, and an outer region. The step region extends outward from the anchored region and has a step thickness. The extension region(s) extend outward from the step region and have extension thickness(es) less than the step thickness. The outer region extends outward from the extension region(s) and has an outer thickness greater than the extension thickness(es).

In some embodiments, the top wall includes at least one vent therein. The actuator is between the top wall and the lower chamber. In some embodiments, the upper chamber of the flow chamber has a length corresponding to an odd integer multiplied by a wavelength divided by four. The wavelength is an acoustic wavelength for a frequency of the vibrational motion. The frequency of the vibrational motion corresponds to a structural resonance for the actuator and to an acoustic resonance for the upper chamber having the wavelength. In some embodiments, the flow chamber also includes an orifice plate having at least one orifice therein. The orifice plate forms a bottom wall of the lower chamber. The actuator is activated to drive the fluid through the at least one orifice. In some embodiments, the cavity or cavities has a length of at least 0.25 and not more than $\frac{2}{3}$ multiplied by a length of a free portion of the actuator. In some embodiments, the width of the cavity is at least fifty micrometers and not more than one hundred micrometers. In some embodiments, the cavity may have a depth of at least 0.25 and not more than 1 multiplied by a height of the upper chamber (e.g. at least fifty micrometers and not more than five hundred micrometers).

In some embodiments, a cooling system is described. The cooling system includes cooling cells, each of which includes the flow chamber. Thus, each cooling cell includes an upper chamber, a cooling element and a lower chamber. The upper chamber includes a top wall. The cooling element is located distally from the top wall. The lower chamber receives a fluid from the upper chamber when the cooling element is activated. Moreover, the top wall includes at least one cavity therein. In some embodiments, each of the plurality of cooling cells further includes a support structure. In such embodiments, the cooling element includes a central region and a perimeter. In addition, the cooling element is supported by the support structure at the central region. At least a portion of the perimeter is unpinned. The cooling element is configured to undergo vibrational motion when activated to drive the fluid from the upper chamber to the lower chamber. In some embodiments, the actuator includes an anchored region and a cantilevered arm. The anchored region is fixed by the support structure. The cantilevered arm extends outward from the anchored region may include a step region, at least one extension region, and an outer region. The step region extends outward from the anchored region and has a step thickness. The extension region(s) extend outward from the step region and have extension thickness(es) less than the step thickness. The outer region extends outward from the extension region(s) and has an outer thickness greater than the extension thickness(es).

In some embodiments, the top wall includes at least one vent therein. In such embodiments, the cooling element is between the top wall and the lower chamber. Further, the upper chamber may have a length corresponding to an odd integer multiplied by a wavelength divided by four. The wavelength is an acoustic wavelength for a frequency of the vibrational motion. The frequency of the vibrational motion corresponds to a structural resonance for the cooling element and to an acoustic resonance for the upper chamber having the wavelength. In some embodiments, each of the cooling cells includes an orifice plate having orifice(s) therein. The orifice plate may form a bottom wall of the lower chamber. The cooling element is activated to drive the fluid through the orifice(s). In some embodiments, the cavity/cavities have a length of at least 0.25 ($\frac{1}{4}$) and not more than $\frac{2}{3}$ multiplied by a length of a free portion of the actuator. In some embodiments, the width of the cavity is at least fifty percent and not more than one hundred percent of the width of the chamber. In some embodiments, the cavity may have a depth of at least 0.25 and not more than 1 multiplied by a height of the upper chamber (e.g. at least fifty micrometers and not more than five hundred micrometers).

A method of cooling a heat-generating structure is described. The method includes driving a cooling element to induce a vibrational motion at a frequency. The cooling element is configured to undergo the vibrational motion when driven to direct a fluid toward through a chamber including an upper chamber, a lower chamber and the cooling element. The upper chamber includes a top wall. The cooling element is located distally from the top wall. The lower chamber receives a fluid from the upper chamber when the cooling element is activated. The top wall includes at least one cavity therein. In some embodiments, the cooling element includes a central region and a perimeter. The cooling element is supported by a support structure at the central region. At least a portion of the perimeter is unpinned. The cooling element is configured to undergo vibrational motion when activated to drive the fluid from the upper chamber to the lower chamber. The top wall includes vent(s) therein. The actuator is between the top wall and the lower chamber. In some embodiments, the cavity/cavities are proximate to the perimeter of the cooling element. In some embodiments, the cavity/cavities have length of at least 0.25 (¼) and not more than ⅔ multiplied by a length of a free portion of the actuator. In some embodiments, the width of the cavity is at least fifty percent and not more than one hundred percent of the width of the chamber. In some embodiments, the cavity may have a depth of at least 0.25 and not more than 1 multiplied by a height of the upper chamber (e.g. at least fifty micrometers and not more than five hundred micrometers).

FIGS. 1A-1F are diagrams depicting an exemplary embodiment of active cooling system 100 usable with heat-generating structure 102 and including a centrally anchored actuator 120. When used in a cooling system, an actuator may also be referred to as a cooling element. Thus, actuator 120 may also be referred to herein as cooling element 120. For clarity, only certain components are shown. FIGS. 1A-1F are not to scale. Although shown as symmetric, cooling system 100 need not be.

Figure 1B:
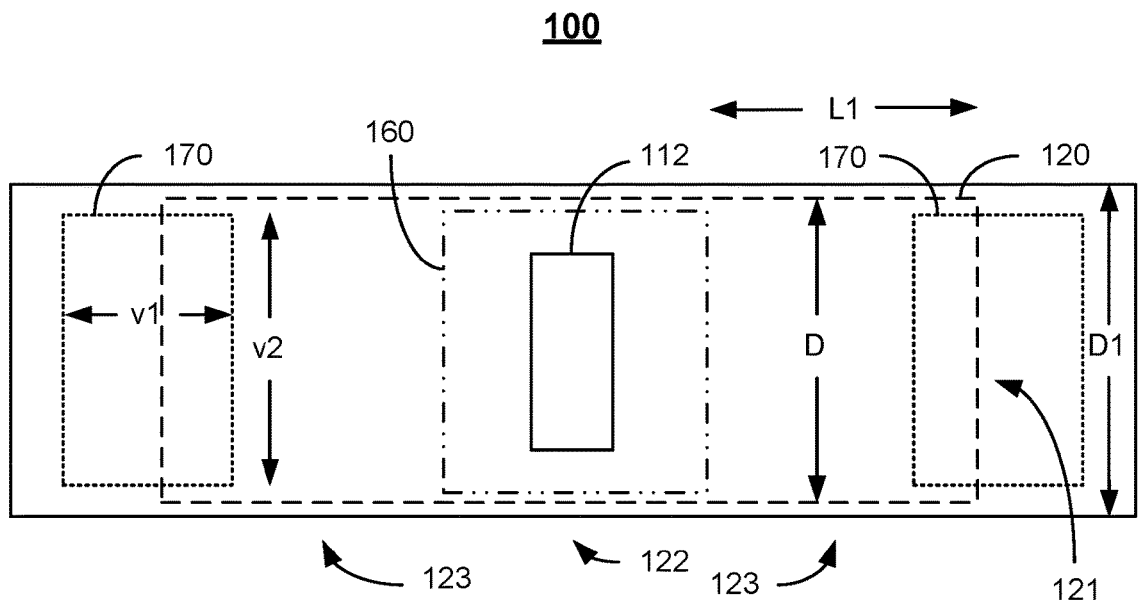

FIGS. 1A and 1B depict cross-sectional and top views of cooling system 100. Cooling system 100 includes top plate 110 having vent 112 therein, actuator (or cooling element) 120, orifice plate 130 having orifices 132 therein, support structure (or "anchor") 160 and chambers 140 and 150 (collectively flow chamber 140/150) formed therein. The top wall of flow/chamber 140/150 is formed by the bottom surface of top plate 110 in the embodiment shown. The top wall of flow chamber 140/150 has cavities 170 therein. Flow chamber 140/150 may thus be considered to be formed between top plate 110 and orifice plate 130. Actuator 120 is supported at its central region by anchor 160. In FIG. 1B, actuator 120 is shown by a dashed line and anchor 160 is shown by a dotted/dashed line. For simplicity, orifices 132 are not depicted in FIG. 1B. Regions of actuator 120 closer to and including portions of the actuator's perimeter (e.g. tip 121) vibrate when actuated. In some embodiments, tip 121 of actuator 120 includes a portion of the perimeter furthest from anchor 160 and undergoes the largest deflection during actuation of actuator 120. For clarity, only one tip 121 of actuator 120 is labeled in FIG. 1A.

FIGS. 1A and 1B depict cooling system 100 in a neutral position. Thus, actuator 120 is shown as substantially flat. For in-phase operation, actuator 120 is driven to vibrate between positions shown in FIGS. 1C and 1D. This vibrational motion draws fluid (e.g. air) into vent 112, through flow chamber 140/150 and out orifices 132 at high speed and/or flow rates. For example, the speed at which the fluid impinges on heat-generating structure 102 may be at least thirty meters per second. In some embodiments, the fluid is driven by actuator 120 toward heat-generating structure 102 at a speed of at least forty-five meters per second. In some embodiments, the fluid is driven toward heat-generating structure 102 by actuator 120 at speeds of at least sixty meters per second. Other speeds may be possible in some embodiments. Cooling system 100 is also configured so that little or no fluid is drawn back into flow chamber 140/150 through orifices 132 by the vibrational motion of actuator 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height of cooling system 100 (from the top of heat-generating structure 102 to the top of top plate 110) may be less than 2 millimeters. In some embodiments, the total height of cooling system 100 is not more than 1.5 millimeters. In some embodiments, the total height does not exceed two hundred and fifty micrometers. In some embodiments, this total height is not more than 1.1 millimeters. In some embodiments, the total height does not exceed one millimeter. Similarly, the distance between the bottom of orifice plate 130 and the top of heat-generating structure 102, y (shown in FIG. 1C), may be small. In some embodiments, y is at least two hundred micrometers and not more than one millimeter. In some embodiments, y is at least two hundred micrometers and not more than three hundred micrometers. Thus, in some embodiments, the distance between the surface of orifice plate 130 closest to heat-generating structure 102 and the surface of top plate 110 furthest from heat-generating structure 102 is not more than seven hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Actuator 120 can be considered to divide the interior of active cooling system 100 (e.g. flow chamber 140/150) into top (or upper) chamber 140 and bottom (or lower) chamber 150. Top chamber 140 is formed by actuator 120, the sides, and top plate 110. Bottom chamber 150 is formed by orifice plate 130, the sides, actuator 120 and anchor 160. Top chamber 140 and bottom chamber 150 are connected at the periphery of actuator 120 and together form flow chamber 140/150 (e.g. an interior chamber of cooling system 100).

The size and configuration of top chamber 140 may be a function of the cell (cooling system 100) dimensions, actuator 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that actuator 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Top plate 110 also includes cavities 170 therein. In FIG. 1B, cavities 170 are depicted by dotted lines. Although shown as having a particular shape (i.e. rectangular), cavities 170 may have another shape including but not limited to triangular, oval, circular, and/or diamond-shaped. Although cavities 170 are shown as symmetric and having the same shape, in some embodiments, cavities 170 may have different shapes and/or may be asymmetric. Although shown as located at the outer edges of flow chamber 140/150, cavities 170 may be located elsewhere. The dimensions of cavities 170 may also vary. Cavities 170 may have a height, u, of at least fifty micrometers and not more than four hundred micrometers (e.g. in some embodiments, at least twenty-five percent of the height, h1, of upper chamber 140 and not more than one hundred percent of the upper chamber height). In some embodiments, cavities 170 may have a height of not more than two hundred micrometers (e.g. not more than fifty percent of the upper chamber height in some embodiments). The length, v1, of cavities 170 may be at least five hundred micrometers and not more than 2.5 millimeters (e.g. in some embodiments, at least twenty-five percent and not more than ⅔ of the length of a free portion of actuator 120). For example, the free portion of actuator 120 may have a length, L1, of three millimeters (e.g. at least one millimeter and not more than five millimeters). In such embodiments, cavities 170 may have a length of at least 1 millimeter and not more than two millimeters. In some embodiments, cavities 170 may have a length of not more than 1.5 millimeters. In some embodiments, the length v1 is at least two multiplied by the distance between tip 121 of actuator 120 and the outer wall of upper chamber 140 (e.g. twice an edge vent length) and not more than half L1. The width of cavities 170, v2, may be at least half of the width, D1, of upper chamber 140 and not more than the width of upper chamber. In some embodiments, cavities 170 have a width of at least six millimeters and not more than eight millimeters. In some embodiments, other shapes may be used for cavities 170. In some such embodiments, the areas of the cavities may be desired to be in the same ranges as for the rectangular cavities indicated above. Because of the presence of cavities 170, top plate 110 may be viewed as having a varying thickness, top chamber 140 (and flow chamber 140/150) may be viewed as having a varying height, and flow chamber 140/150 may be viewed as having a top surface with cavities 170 therein.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. In some embodiments, multiple vents offset out of the plane of the page might be used.

Bottom chamber 150 has a height, h2. In some embodiments, the height of bottom chamber 150 is sufficient to accommodate the motion of actuator 120. Thus, no portion of actuator 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of actuator 120 plus at least five micrometers and not more than ten micrometers. In some embodiments, the deflection of actuator 120 (e.g. the deflection of tip 121) has an amplitude, z (shown in FIG. 1D), of at least ten micrometers and not more than one hundred micrometers. In some such embodiments, the amplitude of deflection of actuator 120 is at least ten micrometers and not more than sixty micrometers. However, the amplitude of deflection of actuator 120 depends on factors such as the desired flow rate through cooling system 100 and the configuration of cooling system 100. Thus, the height of bottom chamber 150 generally depends on the flow rate through and other components of cooling system 100.

Anchor (support structure) 160 supports actuator 120 at the central portion of actuator 120. Thus, at least part of the perimeter of actuator 120 is unpinned and free to vibrate. In some embodiments, anchor 160 extends along a central axis of actuator 120 (e.g. perpendicular to the page in FIGS. 1A-1F). In such embodiments, portions of actuator 120 that vibrate (e.g. including tip 121) move in a cantilevered fashion. Thus, portions of actuator 120 may move in a manner analogous to the wings of a butterfly (i.e. in-phase) and/or analogous to a seesaw (i.e. out-of-phase). Thus, the portions of actuator 120 that vibrate in a cantilevered fashion do so in-phase in some embodiments and out-of-phase in other embodiments. In some embodiments, anchor 160 does not extend along an axis of actuator 120. In such embodiments, all portions of the perimeter of actuator 120 are free to vibrate (e.g. analogous to a jellyfish). In the embodiment shown, anchor 160 supports actuator 120 from the bottom of actuator 120. In other embodiments, anchor 160 may support actuator 120 in another manner. For example, anchor 160 may support actuator 120 from the top (e.g. actuator 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of actuator 120.

Actuator 120 has a first side distal from heat-generating structure 102 and a second side proximate to heat-generating structure 102. In the embodiment shown in FIGS. 1A-1F, the first side of actuator 120 is the top of actuator 120 (further from orifice plate 130) and the second side is the bottom of actuator 120 (closer to orifice plate 130). Actuator 120 is actuated to undergo vibrational motion as shown in FIGS. 1A-1F. The vibrational motion of actuator 120 drives fluid from the first side of actuator 120 distal from heat-generating structure 102 (e.g. from top chamber 140) to a second side of actuator 120 proximate to heat-generating structure 102 (e.g. to bottom chamber 150). Stated differently, actuation of actuator 120 directs fluid through flow chamber 140/150 and from the top chamber 140 to the bottom chamber 150. The vibrational motion of actuator 120 also draws fluid through vent 112 and into top chamber 140; forces fluid from top chamber 140 to bottom chamber 150; and drives fluid from bottom chamber 150 through orifices 132 of orifice plate 130.

Actuator 120 has a length, L, that depends upon the frequency at which actuator 120 is desired to vibrate. In some embodiments, the length of actuator 120 is at least four millimeters and not more than ten millimeters. In some such embodiments, actuator 120 has a length of at least six millimeters and not more than eight millimeters. The depth, D (shown in FIG. 1B), of actuator 120 (e.g. perpendicular to the plane shown in FIGS. 1A and 1C-1F) may vary from one fourth of L through twice L. For example, actuator 120 may have the same depth as length. The thickness, t, of actuator 120 may vary based upon the configuration of actuator 120 and/or the frequency at which actuator 120 is desired to be actuated. In some embodiments, the actuator thickness is at least two hundred micrometers and not more than three hundred and fifty micrometers for actuator 120 having a length of eight millimeters and driven at a frequency of at least twenty kilohertz and not more than twenty-five kilohertz. The length, C, of flow chamber 140/150 is close to the length, L, of actuator 120. For example, in some embodiments, the distance, d, between the edge of actuator 120 and the wall of flow chamber 140/150 is at least one hundred micrometers and not more than one thousand micrometers. In some embodiments, d is at least one hundred micrometers and not more than five hundred micrometers. In some such embodiments, d is at least three hundred micrometers. In some embodiments, d is at least two hundred micrometers and not more than three hundred micrometers. In some embodiments, d is not more than eight hundred micrometers. This distance, d, may be termed the edge vent.

In the embodiment shown, actuator 120 is supported (held in place) by anchor 160 along the central axis (out of the plane of the page in FIG. 1A) at central portion 122 (hereinafter anchored region 122). Thus, cantilevered arms 123 (denoted in FIG. 1B only) that are actuated to vibrate are to the right and left of anchor 160. In some embodiments, actuator 120 is a continuous structure having two portions which are free and actuated (e.g. the cantilevered arms 123). In some embodiments, actuator 120 includes separate cantilevered portions each of which is attached to the anchor 160 and actuated. Cantilevered arms 123 of actuator 120 may be driven to vibrate in a manner analogous to the wings of a butterfly (in-phase) or to a seesaw (out-of-phase).

Although not shown in FIGS. 1A-1F actuator 120 may include one or more piezoelectric layer(s). In some embodiments, piezoelectric may be located only on or in cantilevered arms 123 of actuator 120. In some embodiments, piezoelectric may be on or in all of actuator 120. Thus, actuator 120 may be a multilayer actuator in which the piezoelectric is integrated into actuator 120. For example, actuator 120 may include a piezoelectric layer on substrate. The substrate may be a stainless steel, Ni alloy and/or Hastelloy substrate. In some embodiments, piezoelectric layer includes multiple sublayers formed as thin films on the substrate. In other embodiments, the piezoelectric layer may be a bulk layer affixed to the substrate. Such a piezoelectric actuator 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric actuator. Although described in the context of a piezoelectric, another mechanism for actuating actuator 120 can be utilized. Such other mechanisms may be on (e.g. affixed to) actuator 120, integrated into actuator 120 or may be located elsewhere (e.g. on anchor 160).

In the embodiment shown in FIG. 1B, anchor 160 extends most but not all of the depth, D, of actuator 120. The entire perimeter of actuator 120 is free. However, anchor 160 still holds in place the central, anchored region 122 of actuator 120. Thus, anchor 160 need not extend the entire length of the central axis in order for cantilevered arms 123 to vibrate as desired. In some embodiments, anchor 160 extends along the central axis to the perimeter of actuator 120. In some such embodiments, anchor 160 has a depth of at least D.

Although actuator 120 is depicted as rectangular, actuators may have another shape. In some embodiments, corners of actuator 120 may be rounded. In some embodiments, the entire cantilevered arm 123 might be rounded. Other shapes are possible. For example, in some embodiments, the anchor may be limited to a region near the center of the actuator. In some such embodiments, the actuator may be symmetric around the anchor. For example, anchor 160 and actuator 120 may have a circular footprint. Such an actuator may be configured to vibrate in a manner analogous to a jellyfish or similar to the opening/closing of an umbrella. In some embodiments, the entire perimeter of such an actuator vibrates in-phase (e.g. all move up or down together). In other embodiments, portions of the perimeter of such an actuator vibrate out-of-phase.

Actuator 120 may be driven at a frequency that is at or near both the resonant frequency for an acoustic resonance of a pressure wave of the fluid in top chamber 140 and the resonant frequency for a structural resonance of actuator 120. The portion of actuator 120 undergoing vibrational motion (e.g. each cantilevered arm 123 having a length (L−a)/2)) is driven at or near resonance (the "structural resonance") of actuator 120. This portion of actuator 120 undergoing vibration may be a cantilevered section in some embodiments. The frequency of vibration for structural resonance is termed the structural resonant frequency. Use of the structural resonant frequency in driving actuator 120 reduces the power consumption of cooling system 100. Actuator 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of actuator 120 and near the connection between top chamber 140 and bottom chamber 150). The distance between these two regions is C/2. Thus, $C/2 = n\lambda/4$, where $\lambda$ is the acoustic wavelength for the fluid and n is odd (e.g. n=1, 3, 5, etc.). For the lowest order mode, $C=\lambda/2$. Because the length of chamber 140 (e.g. C) is close to the length of actuator 120, in some embodiments, it is also approximately true that $L/2 = n\lambda/4$, where $\lambda$ is the acoustic wavelength for the fluid and n is odd. Thus, the frequency at which actuator 120 is driven, ν, is at or near the structural resonant frequency for actuator 120. The frequency ν is also at or near the acoustic resonant frequency for at least top chamber 140. The acoustic resonant frequency of top chamber 140 generally varies less dramatically with parameters such as temperature and size than the structural resonant frequency of actuator 120. Consequently, in some embodiments, actuator 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of actuator 120 (tip 121 moves away from orifice plate 13) that would pull fluid into bottom chamber 150 through orifices 132 is reduced. The locations of orifices are also desired to be sufficiently close to tip 121 that suction in the upstroke of actuator 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of actuator 120. In some embodiments r1 is at least one hundred micrometers (e.g. r1≥100 µm) and r2 is not more than one millimeter (e.g. r2≤1000 µm). In some embodiments, orifices 132 are at least two hundred micrometers from tip 121 of actuator 120 (e.g. r1≥200 µm). In some such embodiments, orifices 132 are at least three hundred micrometers from tip 121 of actuator 120 (e.g. r1≥300 µm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Figure 1C:
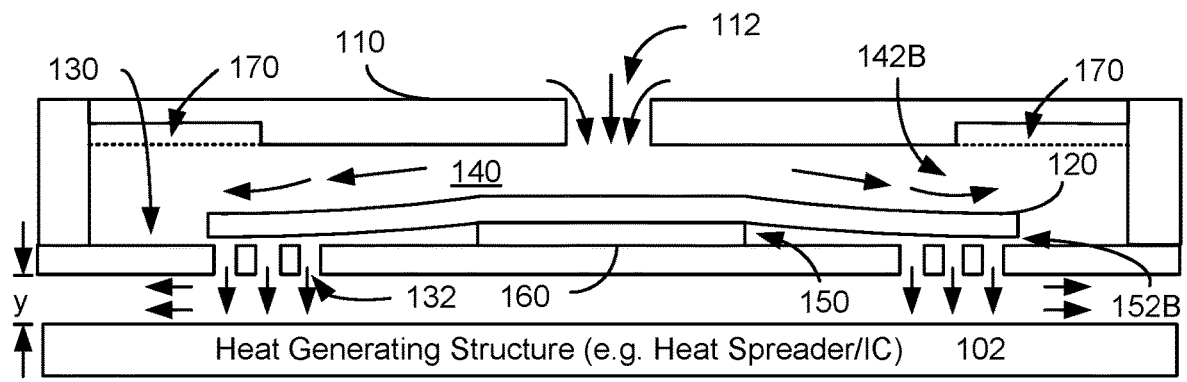
Figure 1D:
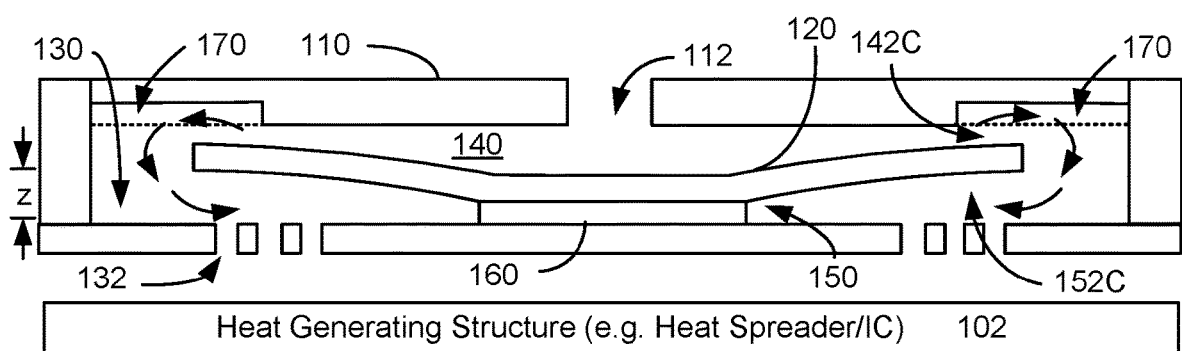

Operation of cooling system 100 is described in the context of FIGS. 1A-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, actuator 120 has been actuated so that its tip 121 moves away from top plate 110. FIG. 1C can thus be considered to depict the end of a down stroke of actuator 120. Because of the vibrational motion of actuator 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when actuator 120 is at the neutral position. As the down stroke continues, bottom chamber 150 decreases in size and top chamber 140 increases in size as shown in FIG. 1C. Thus, fluid is driven out of orifices 132. The fluid driven out of orifices 132 may travel in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat generating structure 102 is shown by unlabeled arrows in FIG. 1C.

Actuator 120 is also actuated so that tip 121 moves away from heat-generating structure 102 and toward top plate 110.

FIG. 1D can thus be considered to depict the end of an up stroke of actuator 120. Because of the motion of actuator 120, gap 142 has decreased in size and is shown as gap 142C. Gap 152 has increased in size and is shown as gap 152C. During the upstroke, a higher pressure is developed at the periphery when actuator 120 is at the neutral position. As the upstroke continues, bottom chamber 150 increases in size and top chamber 140 decreases in size as shown in FIG. 1D. Thus, the fluid is driven from top chamber 140 (e.g. the periphery of flow chamber 140/150) to bottom chamber 150. Thus, when tip 121 of actuator 120 moves up, top chamber 140 serves as a nozzle for the entering fluid to speed up and be driven towards bottom chamber 150. The motion of the fluid into bottom chamber 150 is shown by unlabeled arrows in FIG. 1D. The location and configuration of actuator 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 150.

The motion between the positions shown in FIGS. 1C and 1D is repeated. Thus, actuator 120 undergoes vibrational motion indicated in FIGS. 1C-1D, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, actuator 120 is driven to vibrate at or near the structural resonant frequency of actuator 120. Further, the structural resonant frequency of actuator 120 is configured to align with the acoustic resonance of the flow chamber 140/150. The structural and acoustic resonant frequencies are generally chosen to be in the ultrasonic range. For example, the vibrational motion of actuator 120 may be at frequencies from 15 kHz through 30 kHz. In some embodiments, actuator 120 vibrates at a frequency/frequencies of at least 20 kHz and not more than 30 kHz. The structural resonant frequency of actuator 120 is within ten percent of the acoustic resonant frequency of cooling system 100. In some embodiments, the structural resonant frequency of actuator 120 is within five percent of the acoustic resonant frequency of cooling system 100. In some embodiments, the structural resonant frequency of actuator 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of actuator 120. As a result, heat-generating structure 102 may be cooled.

Figure 1E:
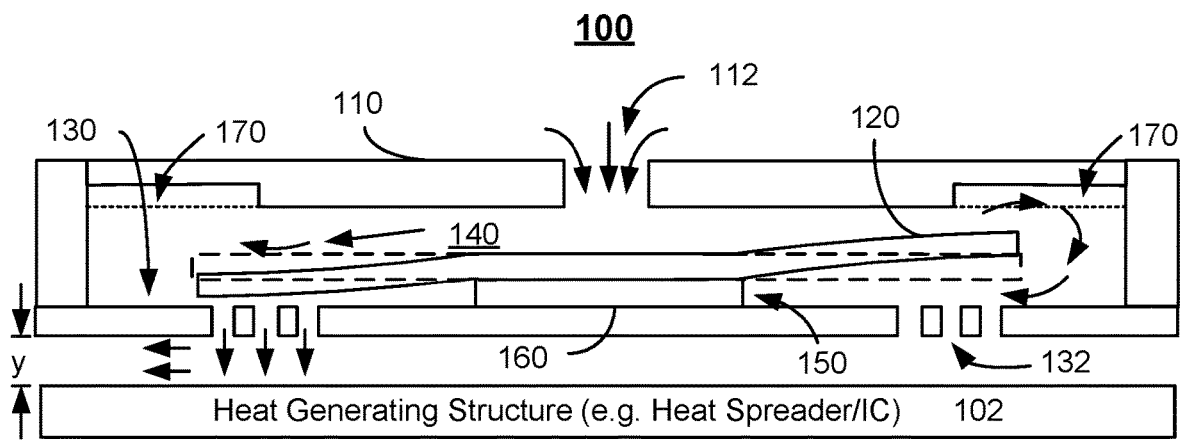
Figure 1F:
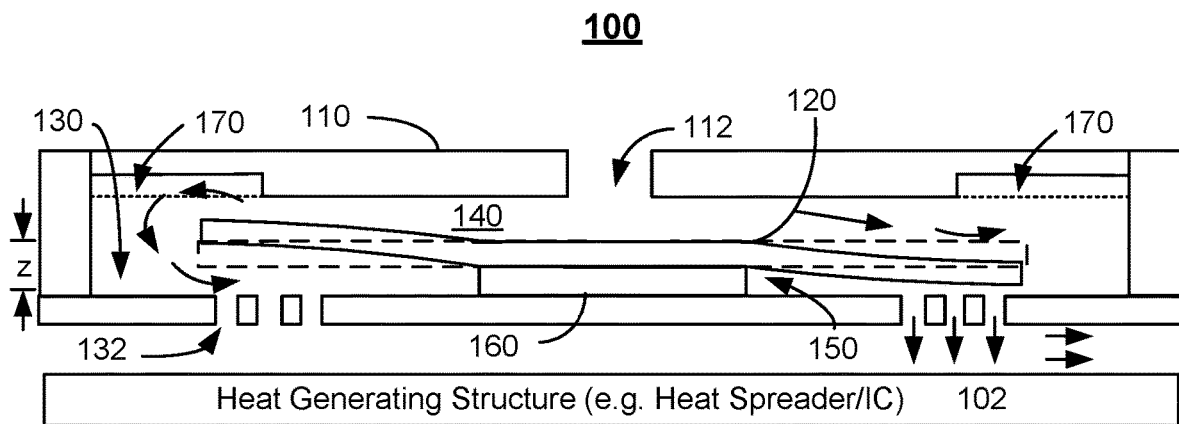

FIGS. 1E-1F depict an embodiment of active cooling system 100 including centrally anchored actuator 120 in which the actuator is driven out-of-phase. More specifically, sections of actuator 120 on opposite sides of anchor 160 (and thus on opposite sides of the central region of actuator 120 that is supported by anchor 160) are driven to vibrate out-of-phase. In some embodiments, sections of actuator 120 on opposite sides of anchor 160 are driven at or near one hundred and eighty degrees out-of-phase. Thus, one section of actuator 120 vibrates toward top plate 110, while the other section of actuator 120 vibrates toward orifice plate 130/heat-generating structure 102. Movement of a section of actuator 120 toward top plate 110 (an upstroke) drives fluid in top cavity 140 to bottom cavity 150 on that side of anchor 160. Movement of a section of actuator 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. The movement of fluid is shown by unlabeled arrows in FIGS. 1E and 1F.

The motion between the positions shown in FIGS. 1E and 1F is repeated. Thus, actuator 120 undergoes vibrational motion indicated in FIGS. 1A, 1E, and 1F, alternately drawing fluid through vent 112 from the distal side of top plate 110 into top chamber 140 for each side of actuator 120; transferring fluid from each side of top chamber 140 to the corresponding side of bottom chamber 150; and pushing the fluid through orifices 132 on each side of anchor 160 and toward heat-generating structure 102. As discussed above, actuator 120 is driven to vibrate at or near the structural resonant frequency of actuator 120. Further, the structural resonant frequency of actuator 120 is configured to align with the acoustic resonance of the flow chamber 140/150. The structural and acoustic resonant frequencies are generally chosen to be in the ultrasonic range. For example, the vibrational motion of actuator 120 may be at the frequencies described for in-phase vibration. The structural resonant frequency of actuator 120 is within ten percent of the acoustic resonant frequency of cooling system 100. In some embodiments, the structural resonant frequency of actuator 120 is within five percent of the acoustic resonant frequency of cooling system 100. In some embodiments, the structural resonant frequency of actuator 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of actuator 120. As a result, heat-generating structure 102 may be cooled.

Using the cooling system 100 actuated for in-phase vibration or out-of-phase vibration, fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because actuator 120 may be vibrated at frequencies of 15 kHz or more, users may not hear any noise associated with actuation of actuators. If driven at or near structural and/or acoustic resonant frequencies, the power used in operating cooling systems may be significantly reduced. Actuator 120 does not physically contact top plate 110 or orifice plate 130 during vibration. Thus, resonance of actuator 120 may be more readily maintained. More specifically, physical contact between actuator 120 and other structures disturbs the resonance conditions for actuator 120. Disturbing these conditions may drive actuator 120 out of resonance. Thus, additional power would need to be used to maintain actuation of actuator 120. Further, the flow of fluid driven by actuator 120 may decrease. These issues are avoided through the use of pressure differentials and fluid flow as discussed above. The benefits of improved, quiet cooling may be achieved with limited additional power. Further, out-of-phase vibration of actuator 120 allows the position of the center of mass of actuator 100 to remain more stable. Although a torque is exerted on actuator 120, the force due to the motion of the center of mass is reduced or eliminated. As a result, vibrations due to the motion of actuator 120 may be reduced. Moreover, efficiency of cooling system 100 may be improved through the use of out-of-phase vibrational motion for the two sides of actuator 120. Consequently, performance of devices incorporating the cooling system 100 may be improved. Further, cooling system 100 may be usable in other applications (e.g. with or without heat-generating structure 102) in which high fluid flows and/or velocities are desired.

Cavities 170 in flow chamber 140/150 may provide additional benefits for operation of cooling system 100. As previously discussed, pressure in top chamber 140 increases during the upstroke of the tip of actuator 120. The presence of cavities 170 mitigates the pressure increase. Cavities 170 are configured such that sufficient pressure is developed to drive fluid from top chamber 140 to bottom chamber 150. This is shown by the arrows indicating the motion of fluid in FIGS. 1D, 1E (right/upstroke portion of actuator 120), and 1F (left/upstroke portion of actuator 120). However, because the pressure has been reduced somewhat, the pressure against which the tips 121 of actuator 120 is driven in the upstroke has been reduced over that of a top chamber that does not include cavities 170 (e.g. a top chamber having a constant height indicated by the dotted lines in FIGS. 1A, 1C and 1E). In an embodiment including cavities 170, therefore, the power required to drive actuator 120 in the upstroke may be reduced. Thus, in addition to the benefits discussed previously, the power required to drive actuator 120 may be reduced while the fluid flow and velocity are maintained.

Similarly, the edge vent (the distance, d, between tip 121 of actuator 120 and the outer wall of flow chamber 140/150) may be used to tailor the pressure in top chamber 140 and bottom chamber 150. In general, a smaller edge vent (lower d) results in a higher pressure in top cavity 140, while a larger edge vent (higher d) results in a lower pressure in top cavity 140. Although the pressure changes, they may be limited change in the flow over a range of edge vent sizes. For example, in the ranges discussed herein (e.g. at least one hundred micrometers and not more than one thousand micrometers, or at least three hundred micrometers and not more than eight hundred micrometers) the pressure actuator 120 is driven against decreases for increasing size of the edge vent substantially without reducing the flow. Thus, the power consumed by driving actuator 120 may be reduced. The edge vent size may be tailored in a number of ways. Flow chamber 140/150 may be made longer (e.g. C increased) without increasing the length of actuator 120, actuator 120 may be made shorter (e.g. L decreased), and/or actuator 120 and anchor 160 may be made shorter (L and a decreased). Increasing the length of flow chamber 140/150 increases the edge vent size without changing the structural resonance of actuator 120. Decreasing the length of actuator 120 and decreasing the length of anchor 160 may increase the edge vent size while maintaining the structural resonant frequency (i.e. L and a decrease such that the free, cantilevered portion of actuator 120 remains the same length).

Figure 2:
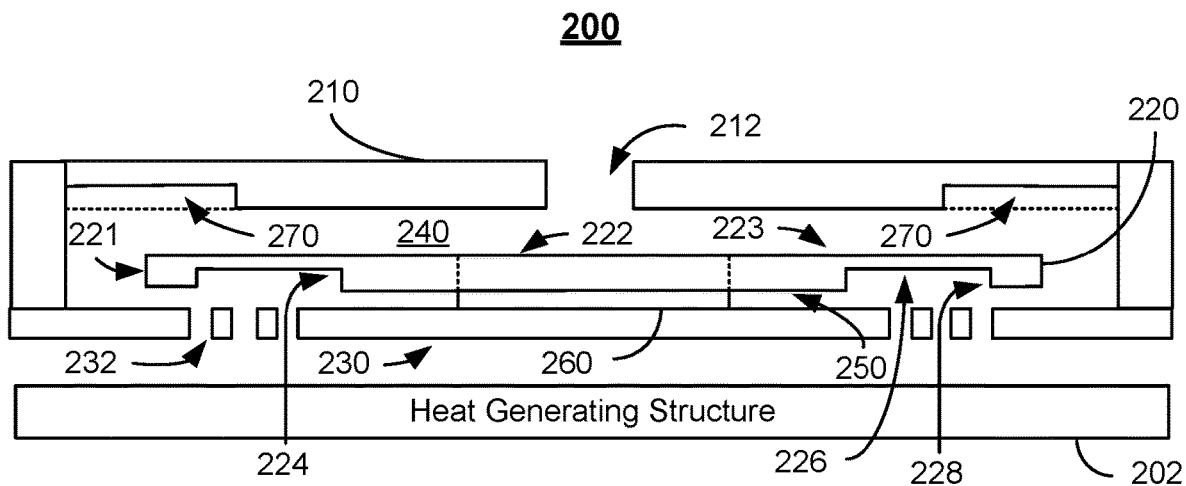
FIG. 2 depicts an embodiment of an active cooling system including an actuator and cavities in the upper chamber.

FIG. 2 depicts embodiments of active cooling system 200 including a centrally anchored, engineered actuator. FIG. 2 is not to scale. For simplicity, only portions of cooling system 200 are shown. Cooling system 200 is analogous to cooling system 100. Consequently, analogous components have similar labels. For example, cooling system 200 is used in conjunction with heat-generating structure 202, which is analogous to heat-generating structure 102. Cooling system 200 includes top plate 210 having vent 212, actuator 220, orifice plate 230 including orifices 232, top chamber 240 having a gap, bottom chamber 250 having a gap, flow chamber 240/250, anchor (i.e. support structure) 260, and cavities 270 that are analogous to top plate 110 having vent 112, actuator 120, orifice plate 130 including orifices 132, top chamber 140 having gap 142, bottom chamber 150 having gap 152, flow chamber 140/150, anchor (i.e. support structure) 160, and cavities 170, respectively. Thus, actuator 220 is centrally supported by anchor 260 such that at least a portion of the perimeter of actuator 220 is free to vibrate.

Actuator 220 includes an anchored region 222 and cantilevered arms 223 that are analogous to anchored region 122 and cantilevered arms 123. The separation between anchored region 222 and cantilevered arms 223 is indicated by a dotted line. Each cantilevered arm 223 ends in tip 221. Anchored region 222 is supported (e.g. held in place) in cooling system 200 by anchor 260. Cantilevered arms 223 undergo vibrational motion in response to actuator 220 being actuated.

Actuator 220 may also be considered an engineered actuator because each cantilevered arm 223 includes step region 224, extension region 226, and outer region 228. In the embodiment shown in FIG. 2, anchored region 222 is centrally located. Step region 224 extends outward (toward tip 121) from anchored region 222. Extension region 226 extends outward from step region 224. Outer region 228 extends outward from extension region 226. In other embodiments, anchored region 222 may be at one edge of the actuator and outer region 228 at the opposing edge. In such embodiments, the actuator is edge anchored.

Extension region 226 has a thickness (extension thickness) that is less than the thickness of step region 224 (step thickness) and less than the thickness of outer region 228 (outer thickness). Thus, extension region 226 may be viewed as recessed. Extension region 226 may also be seen as providing a larger bottom chamber 250. In some embodiments, the outer thickness of outer region 228 is the same as the step thickness of step region 224. In some embodiments, the outer thickness of outer region 228 is different from the step thickness of step region 224. Thus, outer region 228 may be thicker than extension region 224 or thinner than extension region 224 in various embodiments. The outer thickness of outer region 228 and the step thickness of step region 224 are each at least three hundred twenty and not more than three hundred sixty micrometers. In other embodiments, other thicknesses are possible. In some embodiments, the step (difference in step region thickness and extension region thickness) is at least fifty micrometers and not more than two hundred micrometers. In some embodiments, the outer step (difference in outer region thickness and extension region thickness) is at least fifty micrometers and not more than two hundred micrometers. Outer region 228 may have a width (from the inner edge of step region 226 to tip 221) of at least one hundred micrometers and not more than three hundred micrometers. Extension region 226 has a length (from the step region 224 to outer region 228) of at least 0.5 millimeter and not more than 1.5 millimeters in some embodiments. In some embodiments, outer region 228 has a higher mass per unit length (in the direction from anchored region 222 toward tip 221) than extension region 226. This difference in mass may be due to the larger size/thickness of outer region 228, a difference in density between portions of actuator 220, and/or another mechanism.

Cooling system 200 operates in an analogous manner to cooling system 100. Cooling system 200 thus shares the benefits of cooling system 100. Thus, performance of a device employing cooling system 200 may be improved. As for cooling system 100, the presence of cavities 270 may further reduce the pressure against which actuator 220 works against on the upstroke of each cantilevered arm 223. Thus, the power consumed may be reduced.

Use of engineered actuator 220 may further improve performance of cooling system 200. Extension region 226 is thinner than step region 224 and outer region 228. This results in a cavity in the bottom of actuator 220 corresponding to extension region 226. The presence of this cavity aids in improving the efficiency of cooling system 200. In a manner analogous to that discussed with respect to FIGS. 1A-1F, a cantilevered arm 223 vibrates towards top plate 210 in an upstroke and away from top plate 210 in a downstroke. Cantilevered arms 223 may vibrate in-phase or out-of-phase. When a cantilevered arm 223 moves toward top plate 210, higher pressure fluid in top chamber 240 resists the motion of cantilevered arm 223. However, the presence of cavity 270 mitigates the resistance against the upward motion of cantilevered arm 223. Suction in bottom chamber 250 also resists the upward motion of cantilevered arm 223 during the upstroke. In the downstroke of cantilevered arm 223, increased pressure in the bottom chamber 250 and suction in top chamber 240 resist the downward motion of cantilevered arm 223. However, the presence of the cavity in cantilevered arm 223 corresponding to extension region 226 mitigates the suction in bottom chamber 250 during an upstroke. The cavity formed by extension region 226 also reduces the increase in pressure in bottom chamber 250 during a downstroke. Similarly, cavity 270 may reduce the suction from top chamber 240. Because the suction and pressure increase are reduced in magnitude for both the upstroke and the downstroke, cantilevered arms 223 may more readily move through the fluid than cantilevered arms 123. This may be achieved while substantially maintaining a sufficiently high pressure in top chamber 240 to drive the fluid flow through cooling system 200. Thus, efficiency may be improved.

Moreover, the presence of outer region 228 may improve the ability of cantilevered arm 223 to move through the fluid being driven through cooling system 200. Outer region 228 has a higher mass and thus a higher momentum. Consequently, outer region 228 may improve the ability of cantilevered arms 223 to move through the fluid being driven through cooling system 200. The magnitude of the deflection of cantilevered arm 223 may also be increased. These benefits may be achieved while maintaining the stiffness of cantilevered arms 223 through the use of thicker step region 224. Thus, efficiency of cooling system 200 may again be improved.

The improvement may also be understood as follows. Q can be considered a measure of the efficiency of actuator 220. The value of Q is determined at least in part by the interaction of actuator 220 with the surrounding fluid (i.e. a gas such as air or a liquid), structural losses within actuator 220, the anchoring of actuator 220, and/or other characteristics. Q can be considered to be defined by $\delta_{res}=Q*\delta_{static}$, where $\delta_{res}$ is the deflection at resonance and $\delta_{static}$ is the corresponding static deflection. The higher the value of Q, the higher the deflection at resonance and the more slowly the deflection decays (i.e. the lower the damping). Because of its engineered configuration, actuator 220 is better able to move through the surrounding fluid. Consequently, a higher static deflection may be achieved, the deflection may be better amplified at resonance, the power consumed to drive actuator 220 may be reduced, and the deflection may die out more slowly (i.e. be subject to reduced damping). Q of actuator 220 and, therefore, efficiency of cooling system 200 may thus be enhanced by the configuration of actuator 220.

Use of engineered actuator 220 may also improve reliability of cooling system 200. Because of its reduced thickness, extension region 226 may be less stiff than outer region 228 and step region 224. This reduction in stiffness reduces the stress on actuator 220 during vibration. Actuator 220 may be less likely to fail. Reliability of cooling system 200 may, therefore, be improved.

Thus, using cooling system 100 and/or cooling system 200, performance may be improved not only over a conventional cooling system (not shown) having a different configuration, but also over a cooling system in which cavities 170/270 are not present and/or in which an actuator is not engineered as actuator 220. This may be further seen in FIGS. 3, 4A and 4B.

Figure 3:
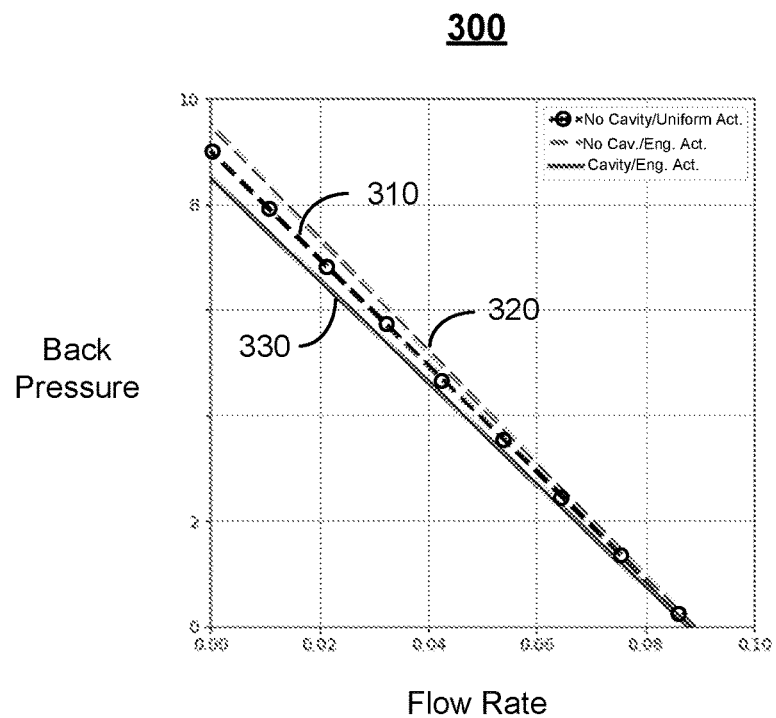
FIG. 3 depicts back pressure versus flow for embodiments of active cooling systems including centrally anchored actuators.

FIG. 3 is a graph 300 depicting back pressure versus flow for embodiments of active cooling systems including centrally anchored actuators. Back pressure is the pressure at which flow through a cooling system goes to zero. Curve 310 indicates the backpressure versus flow rate for a cooling system similar to system 100, but which has a uniform flow chamber (no cavities) and a uniform actuator (analogous to actuator 120). Curve 320 indicates the backpressure versus flow rate for a cooling system similar to system 200, which has a uniform flow chamber (no cavities 170/270) and an engineered actuator (analogous to actuator 220). Curve 330 indicates the backpressure versus flow rate for a cooling system similar to cooling system 200, which has cavities (e.g. cavities 270) and an engineered actuator (analogous to actuator 200). As indicated by FIG. 3, the flow rates, particularly the maximum flow rate at zero backpressure, are substantially the same for curves 310, 320, and 330. However, the backpressure may be reduced without significantly affecting the flow rate. The difference between curves 310 and 320 indicates that use of an engineered actuator such as actuator 220 may reduce the back pressure with little or no effect on the flow rate. As indicated by the difference between curves 320 (no cavity, engineered actuator) and 330 (cavity, engineered actuator), the presence of cavities 170 and/or 270 may reduce the backpressure with little to no effect on the flow rate. Further, changes in the size of cavities 170 and/or 270 may be used to tailor the reduction in backpressure. For example, the area (e.g. length and width) of the cavities may be used to change the reduction in the backpressure. Thus, backpressure as well as the power used to operate cooling systems 100 and 200 may be reduced by the presence of cavities 170 and/or 270 as well as through the use of engineered actuator 220. In addition, the backpressure may be at least partially decoupled from the flow rate.

Figure 4A:
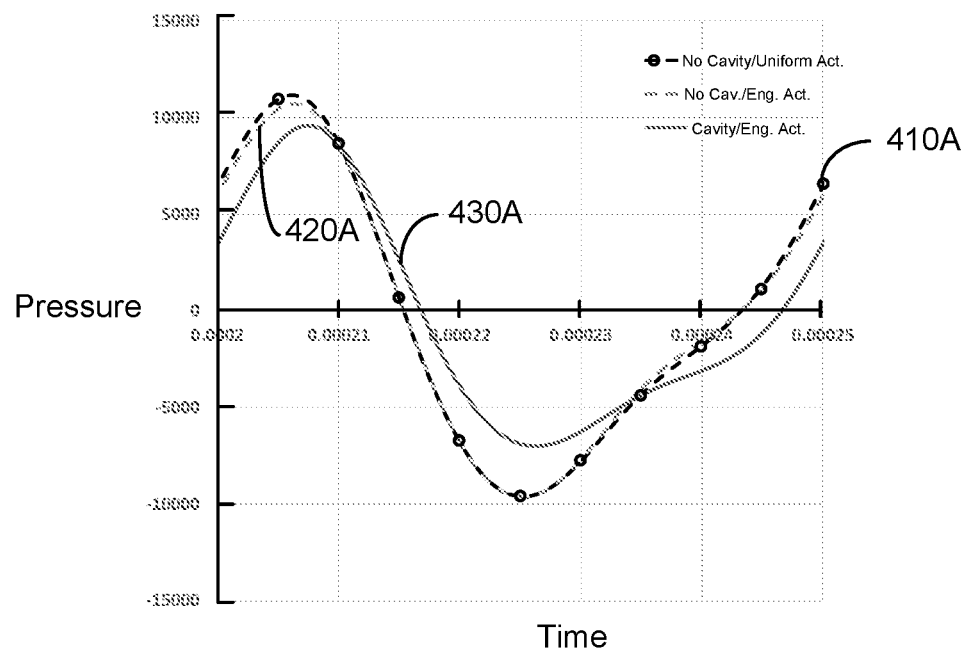
FIGS. 4A-4B are graphs depicting behavior of embodiments of active cooling systems including centrally anchored actuators and cavities.
Figure 4B:
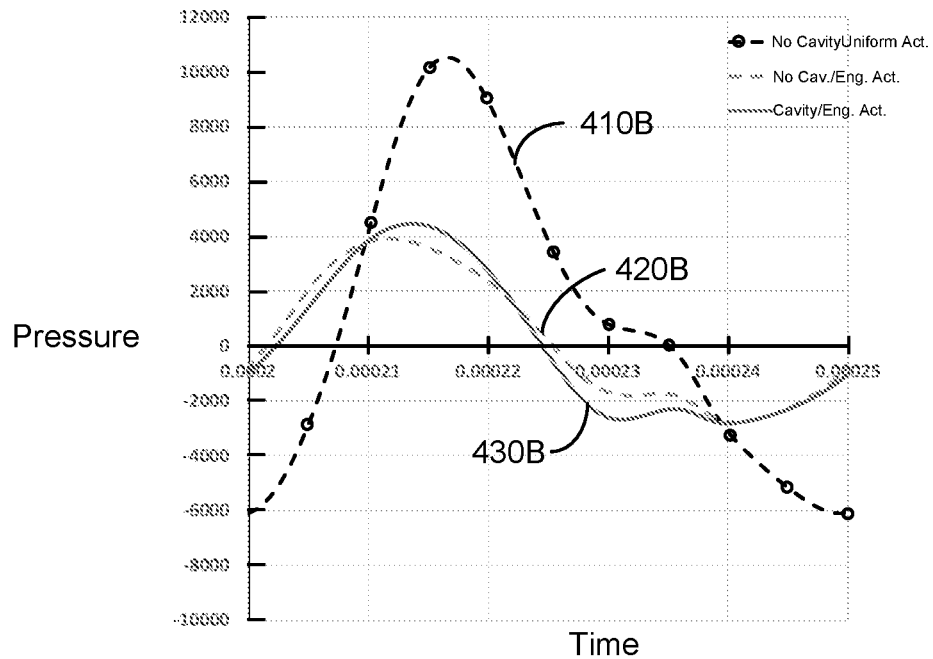

FIGS. 4A and 4B are graphs 400A and 400B, respectively, depicting behavior of embodiments of active cooling systems. FIG. 4A depicts the pressure in the top chamber (e.g. top chamber 140 and/or 240) of the flow chamber versus time through a cycle of vibration of the actuator (e.g. actuator 120 and/or 220). FIG. 4B depicts the pressure in the bottom chamber (e.g. bottom chamber 150 and/or 250) of the flow chamber versus time through a cycle of vibration of the actuator (e.g. actuator 120 and/or 220).

In FIG. 4A, curve 410A indicates the pressure in the top chamber versus time for a cooling system similar to system 100, but which has a uniform flow chamber (no cavities) and a uniform actuator (analogous to actuator 120). Curve 420A indicates the pressure in the top chamber versus time for a cooling system similar to system 200, but which has a uniform flow chamber (no cavities 170/270) and an engineered actuator (analogous to actuator 220). Curve 430A indicates the pressure in the top chamber versus time for a cooling system similar to cooling system 200, which has cavities (e.g. cavities 270) and an engineered actuator (analogous to actuator 200). Thus, one cycle (e.g. actuator 120 varies between the positions shown in FIGS. 1C and 1D or between the positions shown in FIGS. 1E and 1F) is shown. Use of an engineered actuator having a cavity in the surface closest to the orifice plate (e.g. actuator 220) does not significantly alter the pressure in the top chamber against which the actuator works. Thus, curves 410A and 420A are very similar. However, the introduction of cavities (e.g. cavities 170 and/or 270) mitigates the pressure changes in the top chamber (e.g. top chamber 140 and/or 240). This can be seen by the difference between curve 430A and curves 410A and 420A. Because of the presence of the cavities, the pressure against which an actuator is driven is reduced in magnitude. Thus, the actuator may be driven at lower power.

In FIG. 4B, curve 410B indicates the pressure in the bottom chamber versus time for a cooling system similar to system 100, but which has a uniform flow chamber (no cavities) and a uniform actuator (analogous to actuator 120). Curve 420B indicates the pressure in the bottom chamber versus time for a cooling system similar to system 200, but which has a uniform flow chamber (no cavities 170/270) and an engineered actuator (analogous to actuator 220). Curve 430B indicates the pressure in the bottom chamber versus time for a cooling system similar to cooling system 200, which has cavities (e.g. cavities 270) and an engineered actuator (analogous to actuator 200). Thus, one cycle (e.g. actuator 120 varies between the positions shown in FIGS. 1C and 1D or between the positions shown in FIGS. 1E and 1F) is shown. Use of an engineered actuator having a cavity in the surface closest to the orifice plate (e.g. actuator 220) significantly reduces the pressure in the bottom chamber (e.g. bottom chamber 150 and/or 250) against which the actuator works. Thus, a significant reduction in the magnitude of the pressure can be seen between curves 410B and 420B. However, the introduction of cavities (e.g. cavities 170 and/or 270) does not significantly change the pressure in the bottom chamber. Thus, curve 430B is very similar to curve 420B. Because of the use of the engineered actuator having a cavity formed by the extension region, the pressure against which an actuator is driven is reduced in magnitude. Thus, the actuator may be driven at lower power.

As can be seen in FIGS. 3, 4A, and 4B, fluid flow through flow chamber(s) 140/150 and/or 240/250 may be maintained while reducing the pressure within the chambers 140, 150, 240, and/or 250. Thus, a high fluid flow volume may be provided while reducing the operating power of cooling systems 100 and/or 200. Thus, performance of cooling systems 100 and/or 200 may be improved not only over conventional cooling systems, but also a cooling system which does not use cavities and/or engineered actuators.

Figure 5:
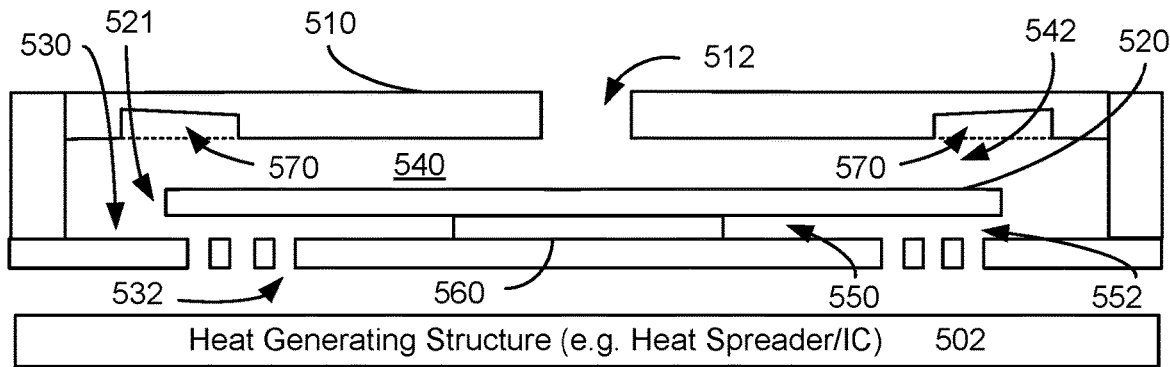
FIG. 5 depicts an embodiment of an active cooling system including an actuator and cavities in the upper chamber.

FIG. 5 depicts an embodiment of an active cooling system 500 including an actuator and cavities in the upper chamber. FIG. 5 is not to scale. For simplicity, only portions of cooling system 500 are shown. Cooling system 500 is analogous to cooling system(s) 100 and/or 200. Consequently, analogous components have similar labels. For example, cooling system 500 is used in conjunction with heat-generating structure 502, which is analogous to heat-generating structure 102.

Cooling system 500 includes top plate 510 having vent 512, actuator 520, orifice plate 530 including orifices 532, top chamber 540 having a gap, bottom chamber 550 having a gap, flow chamber 540/550, anchor (i.e. support structure) 560, and cavities 570 that are analogous to top plate 110 having vent 112, actuator 220, orifice plate 130 including orifices 132, top chamber 140 having gap 142, bottom chamber 150 having gap 152, flow chamber 140/150, anchor (i.e. support structure) 160, and cavities 170, respectively. Thus, actuator 520 is centrally supported by anchor 560 such that at least a portion of the perimeter of actuator 520 is free to vibrate. Although not labeled in FIG. 5, anchor 560 extends along the axis of actuator 520 such that actuator 520 includes cantilevered arms and a central, anchored region analogous to actuator 520. In some embodiments, actuator 520 may be engineered in a manner analogous to actuator 220. Thus, actuator 520 may an anchored region and cantilevered arms including step region, extension region and outer regions analogous to anchored region 222, cantilevered arms 223, step region 224, extension region 226 and outer region 228, respectively. In some embodiments, cantilevered arms of actuator 520 are driven in-phase. In some embodiments, cantilevered arms of actuator 520 are driven out-of-phase. In other embodiments, anchor 560 is only near the center portion of actuator 520. Cooling system 500 operates in a manner analogous to cooling systems 100 and/or 200.

Flow chamber 540/550 includes cavities 570. In the embodiment shown, cavities 570 have been moved closer to the center of actuator 520. In addition, the depth of cavities 570 varies with distance from the center axis of actuator 520. Thus, the cavities may not terminate at the outer wall of the flow chamber in some embodiments. In some embodiments, cavities 570 may have a shape other than rectangular. Thus, the location, depth, shape, and/or other properties of cavities 570 may vary. However, cavities 570 may still be configured to mitigate the pressure in top chamber 540 in a manner analogous to that described in the context of FIGS. 3-4B.

Cooling system 500 thus shares the benefits of cooling system(s) 100 and/or 200. Thus, performance of a device employing cooling system 500 may be improved. In a manner analogous to cooling system(s) 100 and/or 200, cavities 570 may further reduce the pressure against which actuator 520 works against. Thus, the power consumed may be reduced. Further, if an engineered actuator analogous to actuator 220 is used in place of uniform actuator 520, further benefits of system 200 may be achieved. Thus, performance, reliability and power consumption may be improved.

Figure 6A:
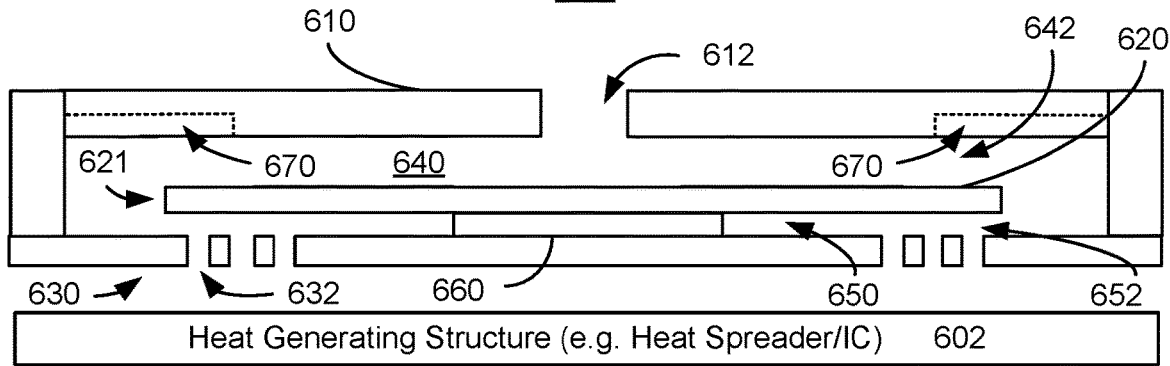
FIGS. 6A-6B depict an embodiment of an active cooling system including an actuator and cavities in the upper chamber.
Figure 6B:
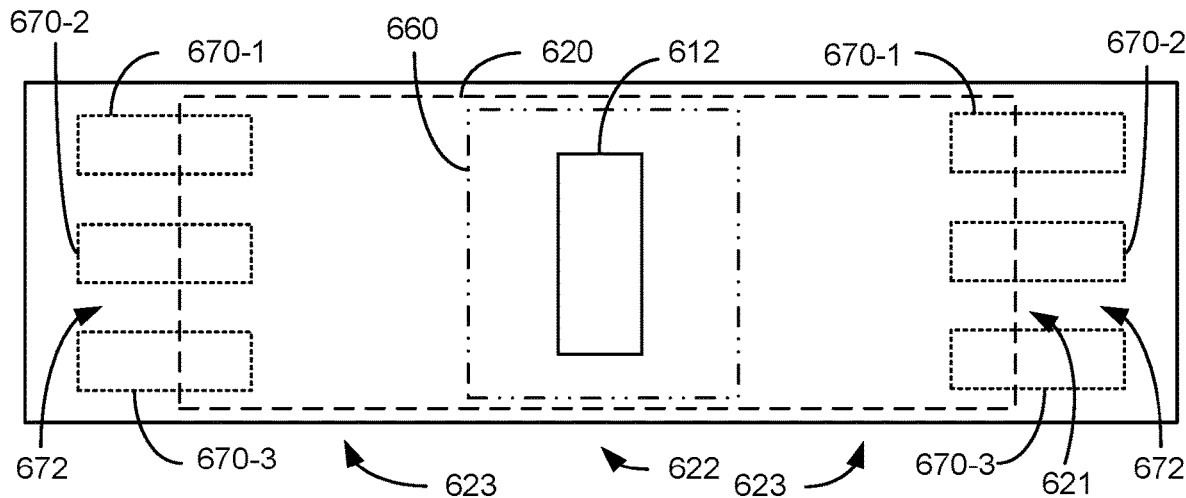

FIGS. 6A-6B depict an embodiment of active cooling system 600 including an actuator and cavities in the upper chamber. FIG. 6A is a side view of cooling system 600, while FIG. 6B is a plan view of cooling system 600. FIGS. 6A-6B are not to scale. For simplicity, only portions of cooling system 600 are shown. Cooling system 600 is analogous to cooling system(s) 100, 200, and/or 500. Consequently, analogous components have similar labels. For example, cooling system 600 is used in conjunction with heat-generating structure 602, which is analogous to heat-generating structure 102.

Cooling system 600 includes top plate 610 having vent 612, actuator 620, orifice plate 630 including orifices 632, top chamber 640 having a gap, bottom chamber 650 having a gap, flow chamber 640/650, anchor (i.e. support structure) 660, and cavities 670-1, 670-2, and 670-3 (collectively or generically cavities 670) that are analogous to top plate 110 having vent 112, actuator 220, orifice plate 130 including orifices 132, top chamber 140 having gap 142, bottom chamber 150 having gap 152, flow chamber 140/150, anchor (i.e. support structure) 160, and cavities 170, respectively. Thus, actuator 620 is centrally supported by anchor 660 such that at least a portion of the perimeter of actuator 620 is free to vibrate. Although not labeled in FIGS. 6A-6B, anchor 660 extends along the axis of actuator 620 such that actuator 620 includes cantilevered arms and a central, anchored region analogous to actuator 620. In some embodiments, actuator 620 may be engineered in a manner analogous to actuator 220. Thus, actuator 620 may an anchored region and cantilevered arms including step region, extension region and outer regions analogous to anchored region 222, cantilevered arms 223, step region 224, extension region 226 and outer region 228, respectively. In some embodiments, cantilevered arms of actuator 620 are driven in-phase. In some embodiments, cantilevered arms of actuator 620 are driven out-of-phase. In other embodiments, anchor 660 is only near the center portion of actuator 620. Cooling system 600 operates in a manner analogous to cooling systems 100, 200 and/or 500.

Flow chamber 640/650 includes cavities 670. In the embodiment shown, cavities 670-1, 670-2 and 670-3 and the spaces 672 (of which only two are labeled in FIGS. 6A-6B) between cavities 670-1, 670-2 and 670-3 occupy approximately the same region of top plate 610 as cavities 170 occupy of top plates 110 in cooling system 100. However, the spaces 672 between cavities 670-1, 670-2 and 670-3 are thicker (e.g. are not recessed or recessed a smaller amount than cavities 670-1, 670-2 and 670-3. Cavities 670 may still be configured to mitigate the pressure in top chamber 640 in a manner analogous to that described in the context of FIGS. 3-4B. In addition, the spacers 672 may mitigate the reduction in stiffness of top plate 610 that cavities 670 introduce. Because top plate 610 may be stiffer, vibrations due to the motion of actuator 610 may be reduced.

Cooling system 600 thus shares the benefits of cooling system(s) 100, 200, and/or 500. Thus, performance of a device employing cooling system 600 may be improved. In a manner analogous to cooling system(s) 100, 200, and/or 500, cavities 670 may further reduce the pressure against which actuator 620 works against. Thus, the power consumed may be reduced. Further, if an engineered actuator analogous to actuator 220 is used in place of uniform actuator 520, further benefits of system 200 may be achieved. Vibrations may also be reduced because of the enhanced stiffness of top plate 610. Thus, performance, reliability and power consumption may be improved.

Figure 7A:
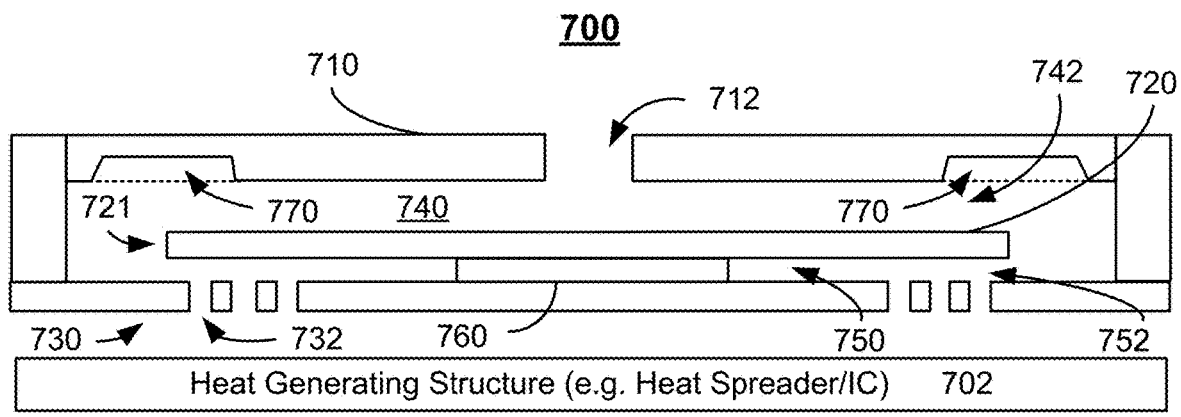
FIGS. 7A-7B depict an embodiment of an active cooling system including an actuator and cavities in the upper chamber.
Figure 7B:
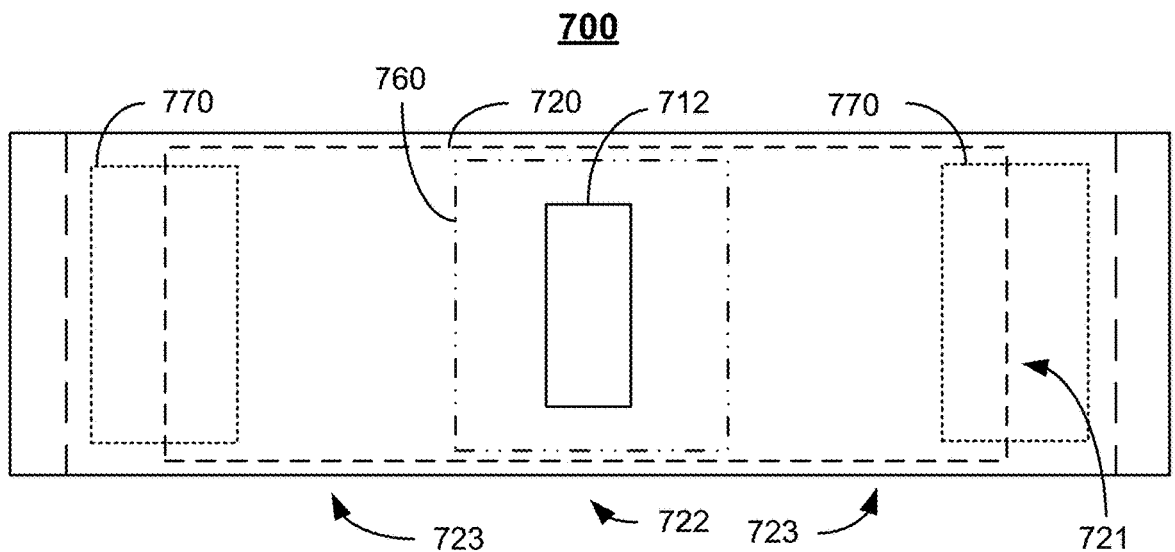

FIGS. 7A-7B depict an embodiment of active cooling system 700 including an actuator and cavities in the upper chamber. FIG. 7A is a side view of cooling system 700, while FIG. 7B is a plan view of cooling system 700. FIGS. 7A-7B are not to scale. For simplicity, only portions of cooling system 700 are shown. Cooling system 700 is analogous to cooling system(s) 100, 200, 500 and/or 600. Consequently, analogous components have similar labels. For example, cooling system 700 is used in conjunction with heat-generating structure 702, which is analogous to heat-generating structure 102.

Cooling system 700 includes top plate 710 having vent 712, actuator 720, orifice plate 730 including orifices 732, top chamber 740 having a gap, bottom chamber 750 having a gap, flow chamber 740/750, anchor (i.e. support structure) 760, and cavities 770 that are analogous to top plate 110 having vent 112, actuator 220, orifice plate 130 including orifices 132, top chamber 140 having gap 142, bottom chamber 150 having gap 152, flow chamber 140/150, anchor (i.e. support structure) 160, and cavities 170, respectively. Thus, actuator 720 is centrally supported by anchor 760 such that at least a portion of the perimeter of actuator 720 is free to vibrate. Although not labeled in FIG. 7, anchor 760 extends along the axis of actuator 720 such that actuator 720 includes cantilevered arms and a central, anchored region analogous to actuator 720. In some embodiments, actuator 720 may be engineered in a manner analogous to actuator 220. Thus, actuator 720 may an anchored region and cantilevered arms including step region, extension region and outer regions analogous to anchored region 222, cantilevered arms 223, step region 224, extension region 226 and outer region 228, respectively. In some embodiments, cantilevered arms of actuator 720 are driven in-phase. In some embodiments, cantilevered arms of actuator 720 are driven out-of-phase. In other embodiments, anchor 760 is only near the center portion of actuator 720. Cooling system 700 operates in a manner analogous to cooling systems 100, 200, 500, and/or 600.

Flow chamber 740/750 includes cavities 770. In the embodiment shown, cavities 770 have been moved closer to the center of actuator 720. Thus, cavities 770 may not terminate at the outer wall of the flow chamber in some embodiments. In some embodiments, cavities 770 may have a shape other than rectangular. In addition, the sidewalls of cavities 770 are not perpendicular to the bottom surface of top plate 710. Thus, the location, depth, shape, and/or other properties of cavities 770 may vary. Cavities 770 may still be configured to mitigate the pressure in top chamber 740 in a manner analogous to that described in the context of FIGS. 3-4B.

Cooling system 700 thus shares the benefits of cooling system(s) 100, 200, 500, and/or 600. Thus, performance of a device employing cooling system 700 may be improved. In a manner analogous to cooling system(s) 100, 200, 500, and/or 600, cavities 770 may further reduce the pressure against which actuator 720 works against. Thus, the power consumed may be reduced. Further, if an engineered actuator analogous to actuator 720 is used in place of uniform actuator 520, further benefits of system 200 may be achieved. Thus, performance, reliability and power consumption may be improved.

Figure 8:
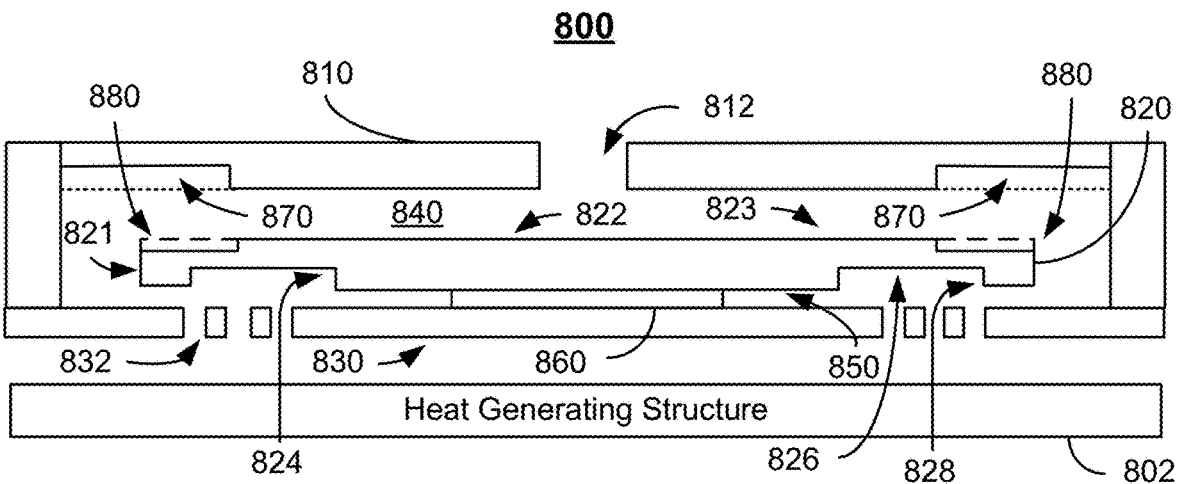
FIG. 8 depicts an embodiment of an active cooling system including an actuator and cavities in the upper chamber.

FIG. 8 depicts an embodiment of active cooling system 800 including an actuator and cavities in the upper chamber. FIG. 8 is not to scale. For simplicity, only portions of cooling system 800 are shown. Cooling system 800 is analogous to cooling system(s) 100, 200, 500, 600 and/or 700. Consequently, analogous components have similar labels. For example, cooling system 800 is used in conjunction with heat-generating structure 802, which is analogous to heat-generating structure 102.

Cooling system 800 includes top plate 810 having vent 812, actuator 820, orifice plate 830 including orifices 832, top chamber 840 having a gap, bottom chamber 850 having a gap, flow chamber 840/850, anchor (i.e. support structure) 860, and cavities 870 that are analogous to top plate 110 having vent 112, actuator 220, orifice plate 130 including orifices 132, top chamber 140 having gap 142, bottom chamber 150 having gap 152, flow chamber 140/150, anchor (i.e. support structure) 160, and cavities 170, respectively. Thus, actuator 820 is centrally supported by anchor 860 such that at least a portion of the perimeter of actuator 820 is free to vibrate. Although not labeled in FIG. 8, anchor 860 extends along the axis of actuator 820 such that actuator 820 includes cantilevered arms and a central, anchored region. In the embodiment shown, actuator 820 may be engineered in a manner analogous to actuator 220. Thus, actuator 820 includes anchored region 822, cantilevered arms 823, step region 824, extension region 826 and outer region 828 analogous to anchored region 222, cantilevered arms 223, step region 224, extension region 226 and outer region 228, respectively. In some embodiments, actuator 800 may be configured in another manner. For example, in some embodiments, actuator 820 may be a simple actuator analogous to actuator 120. In some embodiments, cantilevered arms of actuator 820 are driven in-phase. In some embodiments, cantilevered arms of actuator 820 are driven out-of-phase. In other embodiments, anchor 860 is only near the center portion of actuator 820. Cooling system 800 operates in a manner analogous to cooling systems 100, 200, 500, 600, and/or 700.

Actuator 820 also includes recessed regions 880 near tips 821. Recessed regions 880 function in a manner analogous to cavity 870. Thus, recessed regions 880 may reduce the pressure against which actuator 820 has to work when driving fluid through flow chamber 840/850. Thus, power consumption may be reduced.

Cooling system 800 shares the benefits of cooling system(s) 100, 200, 500, 600, and/or 700. Thus, performance of a device employing cooling system 800 may be improved. In a manner analogous to cooling system(s) 100, 200, 500, 600 and/or 700, cavities 870 and recessed regions 880 may further reduce the pressure against which actuator 820 works against. Thus, the power consumed may be reduced. Further, because engineered actuator 820 analogous to actuator 220 is used in place of a uniform actuator, further benefits of system 200 may be achieved for system 800.

Figure 9:
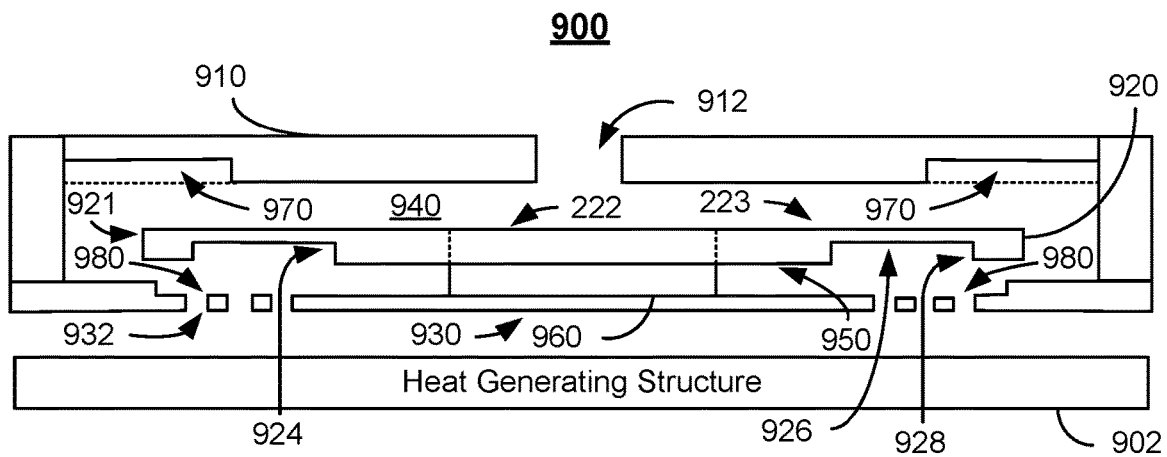
FIG. 9 depicts an embodiment of an active cooling system including an actuator and cavities in the upper chamber.

FIG. 9 depicts an embodiment of active cooling system 900 including an actuator and cavities in the upper chamber. FIG. 9 is not to scale. For simplicity, only portions of cooling system 900 are shown. Cooling system 900 is analogous to cooling system(s) 100, 200, 500, 600, 700, and/or 800. Consequently, analogous components have similar labels. For example, cooling system 900 is used in conjunction with heat-generating structure 902, which is analogous to heat-generating structure 102.

Cooling system 900 includes top plate 910 having vent 912, actuator 920, orifice plate 930 including orifices 932, top chamber 940 having a gap, bottom chamber 950 having a gap, flow chamber 940/950, anchor (i.e. support structure) 960, and cavities 970 that are analogous to top plate 110 having vent 112, actuator 220, orifice plate 130 including orifices 132, top chamber 140 having gap 142, bottom chamber 150 having gap 152, flow chamber 140/150, anchor (i.e. support structure) 160, and cavities 170, respectively. Thus, actuator 920 is centrally supported by anchor 960 such that at least a portion of the perimeter of actuator 920 is free to vibrate. Although not labeled in FIG. 9, anchor 960 extends along the axis of actuator 920 such that actuator 920 includes cantilevered arms and a central, anchored region analogous to actuator 220. In the embodiment shown, actuator 920 may be engineered in a manner analogous to actuator 220. Thus, actuator 920 includes anchored region 922, cantilevered arms 923, step region 924, extension region 926 and outer region 928 analogous to anchored region 222, cantilevered arms 223, step region 224, extension region 226 and outer region 228, respectively. In some embodiments, actuator 800 may be configured in another manner. For example, in some embodiments, actuator 920 may be a simple actuator analogous to actuator 120. In some embodiments, cantilevered arms of actuator 920 are driven in-phase. In some embodiments, cantilevered arms of actuator 920 are driven out-of-phase. In other embodiments, anchor 960 is only near the center portion of actuator 920. Cooling system 900 operates in a manner analogous to cooling systems 100, 200, 500, 600, 700, and/or 800.

Orifice plate 930 includes a recessed regions, or cavities, 980. Although shown as having vertical sidewalls and extending to anchor 960, cavities 980 in in orifice plate 930 (and thus in bottom chamber 950) may be used to control the pressure in flow chamber 940/950. Cavities 980 may reduce the pressure against which actuator 920 has to work when driving fluid through flow chamber 940/950. Thus, power consumption may be reduced. Further, recessed region 980 may be used to control the gap between orifice plate 930 and actuator 920. Consequently, the backflow of fluid through orifices 932 into bottom chamber 950 may be further reduced.

Cooling system 900 shares the benefits of cooling system(s) 100, 200, 500, 600, 700, and/or 800. Thus, performance of a device employing cooling system 900 may be improved. In a manner analogous to cooling system(s) 100, 200, 500, 600, 700 and/or 800, cavities 970 and recessed regions 980 may further reduce the pressure against which actuator 920 works against. Backflow or fluid through orifices 932 may also be controlled. Thus, the power consumed may be reduced. Further, because engineered actuator 920 analogous to actuator 220 is used in place of a uniform actuator, further benefits of system 200 may be achieved for system 900.

Figure 10A:
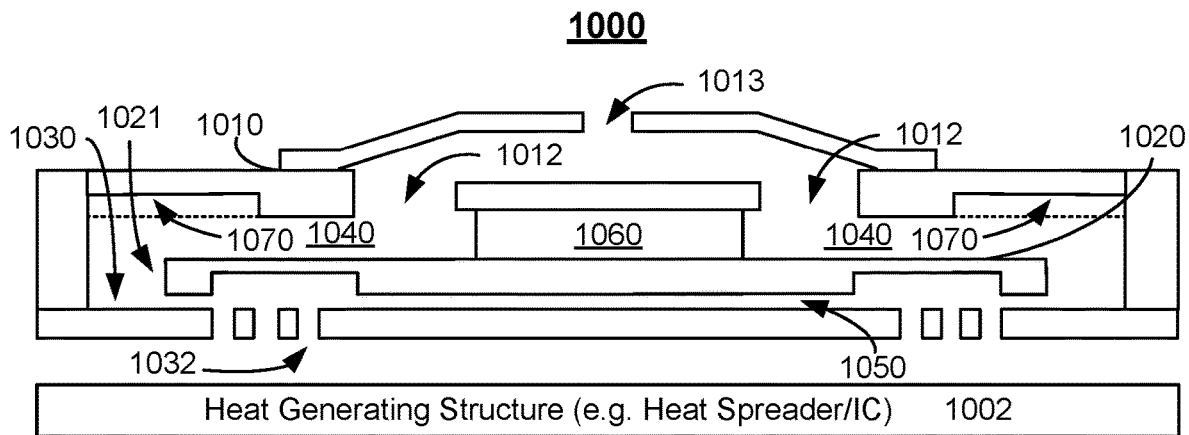
FIGS. 10A-10B depict an embodiment of an active cooling system including an actuator and cavities in the upper chamber.
Figure 10B:
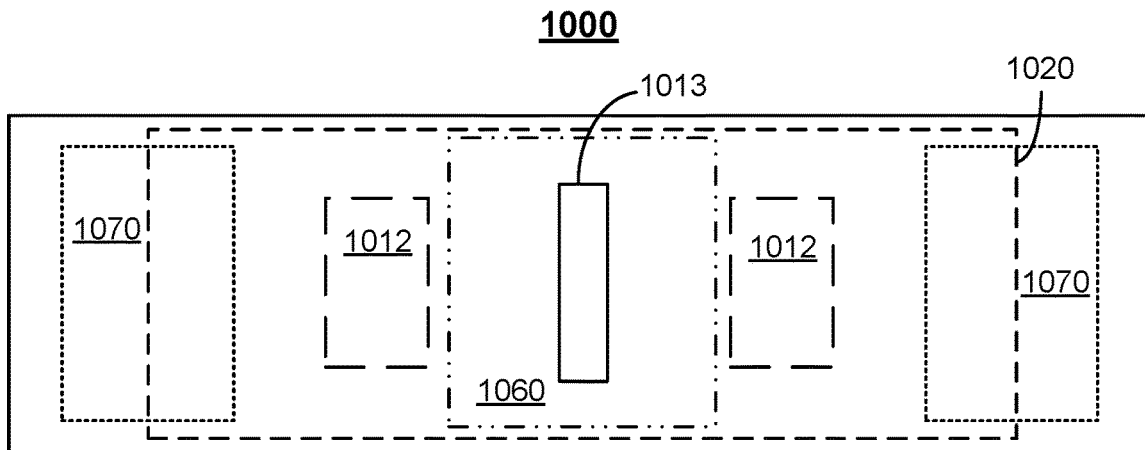

FIGS. 10A-10B depict an embodiment of active cooling system 1000 including a top centrally anchored actuator. FIG. 10A depicts a side view of cooling system 1000 in a neutral position. FIG. 10B depicts a top view of cooling system 1000. FIGS. 10A-10B are not to scale. For simplicity, only portions of cooling system 1000 are shown. Referring to FIGS. 10A-10B, cooling system 1000 is analogous to cooling system(s) 100, 200, 500, 600, 700, 800, and/or 900. Consequently, analogous components have similar labels. For example, cooling system 1000 is used in conjunction with heat-generating structure 1002, which is analogous to heat-generating structure 102.

Cooling system 1000 includes top plate 1010 having vents 1012, actuator 1020, orifice plate 1030 including orifices 1032, top chamber 1040 having a gap, bottom chamber 1050 having a gap, flow chamber 1040/1050, anchor (i.e. support structure) 1060, and cavities 1070 that are analogous to top plate 110 having vent 112, actuator 220, orifice plate 130 including orifices 132, top chamber 140 having gap 142, bottom chamber 150 having gap 152, flow chamber 140/150, anchor (i.e. support structure) 160, and cavities 170, respectively. Thus, actuator 1020 is centrally supported by anchor 1060 such that at least a portion of the perimeter of actuator 1020 is free to vibrate. In some embodiments, anchor 1060 extends along the axis of actuator 1020 (e.g. in a manner analogous to anchor 360C and/or 360D). In other embodiments, anchor 1060 is only near the center portion of actuator 1020 (e.g. analogous to anchor 1060C and/or 1060D). Although not explicitly labeled in FIGS. 10A and 10B, actuator 1020 includes an anchored region and cantilevered arms including step region, extension region and outer regions analogous to anchored region 1022, cantilevered arms 1023, step region 1024, extension region 1026 and outer region 1028, respectively. In some embodiments, cantilevered arms of actuator 1020 are driven in-phase. In some embodiments, cantilevered arms of actuator 1020 are driven out-of-phase. In some embodiments, a simple actuator, such as actuator 120, may be used.

Anchor 1060 supports actuator 1020 from above. Thus, actuator 1020 is suspended from anchor 1060. Anchor 1060 is suspended from top plate 1010. Top plate 1010 includes vent 1013. Vents 1012 on the sides of anchor 1060 provide a path for fluid to flow into sides of chamber 1040.

As discussed above with respect to cooling system 100, actuator 1020 may be driven to vibrate at or near the structural resonant frequency of actuator 1020. Further, the structural resonant frequency of actuator 1020 may be configured to align with the acoustic resonance of the chamber 1040/1050. The structural and acoustic resonant frequencies are generally chosen to be in the ultrasonic range. For example, the vibrational motion of actuator 1020 may be at the frequencies described with respect to cooling system 100. Consequently, efficiency and flow rate may be enhanced. However, other frequencies may be used.

Cooling system 1000 operates in an analogous manner to cooling system(s) 100, 200, 500, 600, 700, 800 and/or 900. Cooling system 1000 thus shares the benefits of cooling system(s) 100, 200, 500, 600, 700, 800 and/or 900. Thus, performance of a device employing cooling system 1000 may be improved. In addition, suspending actuator 1020 from anchor 1060 may further enhance performance. In particular, vibrations in cooling system 1000 that may affect other cooling cells (not shown), may be reduced. For example, less vibration may be induced in top plate 1010 due to the motion of actuator 1020. Consequently, cross talk between cooling system 1000 and other cooling systems (e.g. other cells) or other portions of the device incorporating cooling system 1000 may be reduced. Thus, performance may be further enhanced.

Various cooling systems 100, 200, 500, 600, 700, 800, and 900 have been described and particular features highlighted. Various characteristics of cells 100, 200, 500, 600, 700, 800, 900 and/or 1000 may be combined in manners not explicitly depicted herein.

Figure 11A:
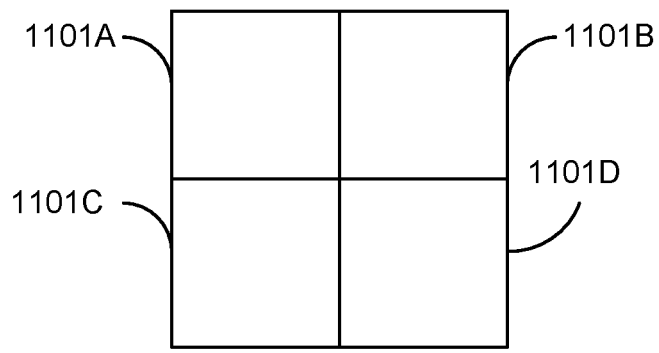
FIGS. 11A-11C depict an embodiment of an active cooling system formed in a tile.
Figure 11B:
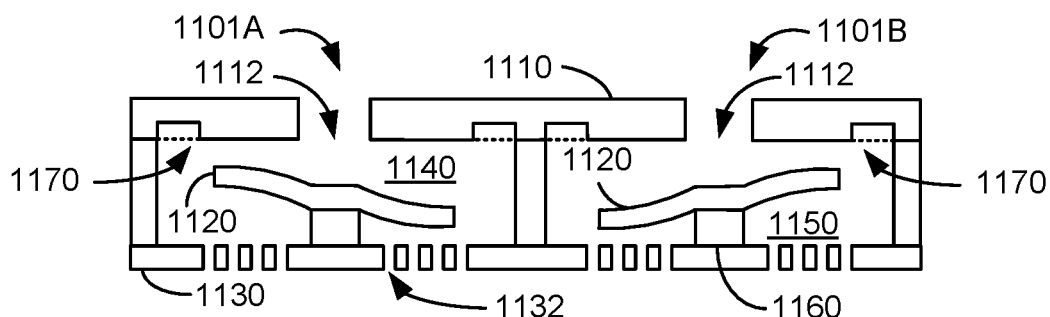
Figure 11C:
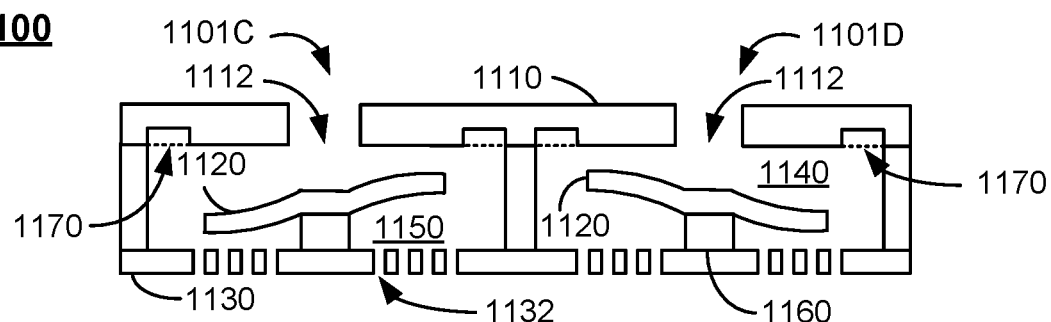

FIGS. 11A-11C depict an embodiment of active cooling system 1100 including multiple cooling cells configured as a tile, or array. FIG. 11A depicts a top view, while FIGS. 11B-11C depict side views. FIGS. 11A-11C are not to scale. Cooling system 1100 includes four cooling cells 1101A, 1101B, 1101C and 1101D (collectively or generically 1101), which are analogous to one or more of cooling systems described herein. More specifically, cooling cells 1101 are analogous to cooling system 100, 200, 500, 600, 700, 800, 900, 1000, and/or some combination thereof. Although four cooling cells 1101 in a 2×2 configuration are shown, in some embodiments another number and/or another configuration of cooling cells 1101 might be employed. Multiple arrays of cooling cells may also be utilized. In the embodiment shown, cooling cells 1101 include shared top plate 1110 having apertures 1112, actuators 1120, shared orifice plate 1130 including orifices 1132, top chambers 1140, bottom chambers 1150, flow chamber 1140/1150, anchors (support structures) 1160, and cavities 1170 that are analogous to top plate 110 having apertures 112, actuator 120, orifice plate 130 having orifices 132, top chamber 140, bottom chamber 150, flow chamber 140/150, anchor 160, and cavities 170, respectively. In some embodiments, cooling cells 1101 may be analogous to cooling system(s) 200, 500, 600, 700, 800, 900, 1000 and/or some combination thereof. In some embodiments, cooling cells 1101 may be fabricated together and separated, for example by cutting through top plate 1110 and orifice plate 1130. Actuators 1120 are driven out-of-phase (i.e. in a manner analogous to a seesaw). Further, as can be seen in FIGS. 11B-11C actuator 1120 in one cell is driven out-of-phase with actuator(s) 1120 in adjacent cell(s). In FIGS. 11B-11C, actuators 1120 in columns and rows are driven out-of-phase. Thus, actuator 1120 in cell 1101A is out-of-phase with actuator 1120 in cell 1101B. Similarly, actuator 1120 in cell 1101C is out-of-phase with actuator 1120 in cell 1101D. Thus, actuators 1120 in cells 1101A and 1101D are in-phase. Actuators 1120 in cells 1101B and 1101C are in-phase. Other configurations, particularly for a larger array, are possible. For example, actuators 1120 in cells 1101A and 1101C may be in phase, actuators 1120 in cells 1101B and 1101D may be in-phase, actuators in cells 1101A and 1101B may be out-of-phase, and actuators 1120 in cells 1101C and 1101D may be out-of-phase. By driving actuators 1120 out-of-phase, vibrations in cooling system 1100 may be reduced.

Cooling cells 1101 of cooling system 1100 function in an analogous manner to cooling system(s) 100, 200, 500, 600, 700, 800, 900, 1000 and/or an analogous cooling system. Consequently, the benefits described herein may be shared by cooling system 1100. Because actuators in nearby cells are driven out-of-phase, vibrations in cooling system 1100 may be reduced. Because multiple cooling cells 1101 are used, cooling system 1100 may enjoy enhanced cooling capabilities. Further, multiples of individual cooling cells 1101 and/or cooling system 1100 may be combined in various fashions to obtain the desired footprint of cooling cells.

Figure 12:
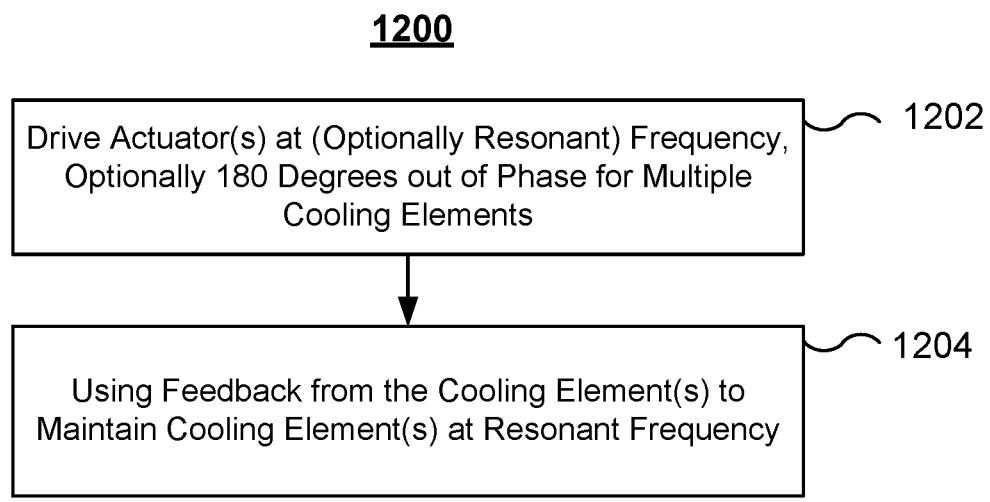
FIG. 12 is a flow chart depicting an embodiment of a method for driving flow through a flow chamber.

FIG. 12 is a flow chart depicting an exemplary embodiment of method 1200 for operating a cooling system. Method 1200 may include steps that are not depicted for simplicity. Method 1200 is described in the context of piezoelectric cooling system 100. However, method 1200 may be used with other cooling systems including but not limited to systems and cells described herein.

One or more of the actuator(s) in a cooling system is actuated to vibrate, at 1202. At 1202, an electrical signal having the desired frequency is used to drive the actuator(s). In some embodiments, the actuators are driven at or near structural and/or acoustic resonant frequencies at 1202. The driving frequency may be 15 kHz or higher. If multiple actuators are driven at 1202, the cooling actuators may be driven out-of-phase. In some embodiments, the actuators are driven substantially at one hundred and eighty degrees out of phase. Further, in some embodiments, individual actuators are driven out-of-phase. For example, different portions of an actuator may be driven to vibrate in opposite directions (i.e. analogous to a seesaw). In some embodiments, individual actuators may be driven in-phase (i.e. analogous to a butterfly). In addition, the drive signal may be provided to the anchor(s), the actuator(s), or both the anchor(s) and the actuator(s). Further, the anchor may be driven to bend and/or translate.

Feedback from the piezoelectric actuator(s) is used to adjust the driving current, at 1204. In some embodiments, the adjustment is used to maintain the frequency at or near the acoustic and/or structural resonant frequency/frequencies of the actuator(s) and/or cooling system. Resonant frequency of a particular actuator may drift, for example due to changes in temperature. Adjustments made at 1204 allow the drift in resonant frequency to be accounted for.

For example, piezoelectric actuator 120 may be driven at its structural resonant frequency/frequencies, at 1202. This resonant frequency may also be at or near the acoustic resonant frequency for top chamber 140. This may be achieved by driving piezoelectric layer(s) in anchor 160 (not shown in FIGS. 1A-1F) and/or piezoelectric layer(s) in actuator 120. At 1204, feedback is used to maintain actuator 120 at resonance and, in some embodiments in which multiple actuators are driven, one hundred and eighty degrees out of phase. Thus, the efficiency of actuator 120 in driving fluid flow through cooling system 100 and onto heat-generating structure 102 may be maintained. In some embodiments, 1204 includes sampling the current through cooling element 120 and/or the current through anchor 160 and adjusting the current to maintain resonance and low input power.

Consequently, actuators, such as actuator(s) 120, 220, 520, 620, 720, 820, 920, 1020 and/or 1120 may operate as described herein. Method 1200 thus provides for use of piezoelectric cooling systems described herein. Further, because of the presence of cavities 170, 270, 570, 670, 770, 870, 880, 970, 980, 1070, and/or 1170, power consumed by cooling system 100, 200, 500, 600, 700, 800, 900, 1000, and/or 1100 may be further reduced. Thus, piezoelectric cooling systems may more efficiently and quietly cool semiconductor devices at lower power.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A flow chamber, comprising:
   an upper chamber including a top wall having a thickness;
   an actuator located distally from the top wall and including a central region and a perimeter;
   a lower chamber receiving a fluid from the upper chamber when the actuator is activated;
   a support structure; and
   wherein the top wall includes at least one cavity therein, the at least one cavity extending though a portion of the thickness of the top wall, and wherein the actuator is supported by the support structure at the central region, at least a portion of the perimeter being completely unpinned from the support structure, the actuator being configured to undergo vibrational motion when activated to drive the fluid from the upper chamber to the lower chamber.

2. The flow chamber of claim 1, wherein the actuator includes an anchored region and a cantilevered arm, the anchored region being fixed by the support structure, the cantilevered arm extending outward from the anchored region and including a step region, at least one extension region, and an outer region, the step region extending outward from the anchored region having a step thickness; the at least one extension region extending outward from the step region and having at least one extension thickness less than the step thickness, and the outer region extending outward from the extension region having an outer thickness greater than the extension thickness.

3. The flow chamber of claim 1, wherein the top wall includes at least one vent therein, the actuator being between the top wall and the lower chamber.

4. The flow chamber of claim 1, wherein the at least one cavity is configured to mitigate a pressure increase in the upper chamber due to vibrational motion of the actuator.

5. The flow chamber of claim 1, further comprising:
   an orifice plate having at least one orifice therein, the orifice plate forming a bottom wall of the lower chamber, the actuator being activated to drive the fluid through the at least one orifice.

6. The flow chamber of claim 5, wherein the actuator has a recessed region therein and/or the orifice plate has an additional cavity therein.

7. The flow chamber of claim 1, wherein the at least one cavity is configured to reduce a back pressure for a flow of the fluid through the flow chamber generated by vibrational motion of the actuator.

8. The flow chamber of claim 1, wherein the actuator includes an anchored region and a cantilevered arm, the anchored region being fixed by the support structure, the cantilevered arm extending outward from the anchored region.

9. A cooling system, comprising:
   a plurality of cooling cells, each of the plurality of cooling cells including an upper chamber, a cooling element, a support structure, and a lower chamber, the upper chamber including a top wall having a thickness, the cooling element being located distally from the top wall and including a central region and a perimeter, the lower chamber receiving a fluid from the upper chamber when the cooling element is activated;

wherein the top wall includes at least one cavity therein, the at least one cavity extending though a portion of the thickness of the top wall, and wherein the cooling element is supported by the support structure at the central region, at least a portion of the perimeter being completely unpinned from the support structure, the cooling element being configured to undergo vibrational motion when activated to drive the fluid from the upper chamber to the lower chamber.

10. The cooling system of claim 9, wherein the cooling element includes an anchored region and a cantilevered arm, the anchored region being fixed by the support structure, the cantilevered arm extending outward from the anchored region and including a step region, at least one extension region, and an outer region, the step region extending outward from the anchored region having a step thickness; the at least one extension region extending outward from the step region and having at least one extension thickness less than the step thickness, and the outer region extending outward from the extension region having an outer thickness greater than the extension thickness.

11. The cooling system of claim 10, wherein each of the plurality of cooling cells further includes:
an orifice plate having at least one orifice therein, the orifice plate forming a bottom wall of the lower chamber, the cooling element being activated to drive the fluid through the at least one orifice.

12. The cooling system of claim 11, wherein the cooling element has a recessed region therein and/or the orifice plate has an additional cavity therein.

13. The cooling system of claim 9, wherein the top wall includes at least one vent therein, the cooling element being between the top wall and the lower chamber.

14. The cooling system of claim 9, wherein the at least one cavity is configured to mitigate a pressure increase in the upper chamber due to vibrational motion of the cooling element.

15. The cooling system of claim 9, wherein the at least one cavity is configured to reduce a back pressure for a flow of the fluid through the cooling system generated by vibrational motion of the cooling element.

16. The cooling system of claim 9, wherein the cooling element includes an anchored region and a cantilevered arm, the anchored region being fixed by the support structure, the cantilevered arm extending outward from the anchored region.

17. A flow chamber, comprising:
an upper chamber including a top wall;
an actuator located distally from the top wall and including a central region and a perimeter;
a support structure; and
a lower chamber receiving a fluid from the upper chamber when the actuator is activated;
wherein the top wall includes at least one cavity therein, the at least one cavity being configured to mitigate a pressure increase in the upper chamber due to vibrational motion in the actuator and to prevent backflow out of the upper chamber through the at least one cavity, and wherein the actuator is supported by the support structure at the central region, at least a portion of the perimeter being completely unpinned from the support structure, the actuator being configured to undergo vibrational motion when activated to drive the fluid from the upper chamber to the lower chamber.

18. The flow chamber of claim 17, wherein the at least one cavity is configured to reduce a back pressure for a flow of the fluid through the flow chamber generated by vibrational motion of the actuator.

19. The flow chamber of claim 17, wherein the actuator has a recessed region therein.

20. The flow chamber of claim 17, wherein the actuator includes an anchored region and a cantilevered arm, the anchored region being fixed by the support structure, the cantilevered arm extending outward from the anchored region.

* * * * *